United States Patent
Eilert et al.

(10) Patent No.: US 11,740,899 B2
(45) Date of Patent: Aug. 29, 2023

(54) IN-MEMORY ASSOCIATIVE PROCESSING SYSTEM

(71) Applicant: Micron Technology, Inc., Boise, ID (US)

(72) Inventors: Sean S. Eilert, Penryn, CA (US); Ameen D. Akel, Rancho Cordova, CA (US); Justin Eno, El Dorado Hills, CA (US); Brian Hirano, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/577,977

(22) Filed: Jan. 18, 2022

(65) Prior Publication Data

US 2023/0069790 A1  Mar. 2, 2023

Related U.S. Application Data

(60) Provisional application No. 63/239,103, filed on Aug. 31, 2021.

(51) Int. Cl.
| | | |
|---|---|---|
| *G06F 1/3225* | (2019.01) | |
| *G06F 16/27* | (2019.01) | |
| *G06F 9/30* | (2018.01) | |
| *G06F 13/16* | (2006.01) | |

(52) U.S. Cl.
CPC ........ *G06F 9/30036* (2013.01); *G06F 9/3004* (2013.01); *G06F 13/1668* (2013.01)

(58) Field of Classification Search
None
See application file for complete search history.

(56) References Cited

U.S. PATENT DOCUMENTS

| | | | |
|---|---|---|---|
| 11,620,187 B2* | 4/2023 | Cypher | G06F 11/1435 707/610 |
| 2008/0162824 A1* | 7/2008 | Jalowiecki | G06F 7/785 711/149 |
| 2015/0227367 A1* | 8/2015 | Eyole-Monono | G06F 9/30076 712/7 |
| 2016/0224465 A1* | 8/2016 | Morad | G06F 9/3887 |
| 2018/0307486 A1* | 10/2018 | Botman | G06F 9/30036 |
| 2022/0244959 A1* | 8/2022 | Ilan | G06F 9/3004 |
| 2023/0035474 A1* | 2/2023 | Beckman | G06F 15/8038 |
| 2023/0065783 A1* | 3/2023 | Eilert | G06F 3/0679 |
| 2023/0069790 A1* | 3/2023 | Eilert | G06F 13/1668 |

* cited by examiner

*Primary Examiner* — Hyun Nam

(74) *Attorney, Agent, or Firm* — Holland & Hart LLP

(57) ABSTRACT

Methods, systems, and devices for in-memory associative processing are described. An apparatus may receive a set of instructions that indicate a first vector and a second vector as operands for a computational operation. The apparatus may select, from a set of vector mapping schemes, a vector mapping scheme for performing the computational operation using associative processing. The apparatus may write the first vector and the second vector to a set of planes each comprising an array of content-addressable memory cells based on the selected vector mapping scheme.

35 Claims, 12 Drawing Sheets

IN-MEMORY ASSOCIATIVE PROCESSING SYSTEM

CROSS REFERENCE

The present application for patent claims the benefit of U.S. Provisional Patent Application No. 63/239,103 by Eilert et al., entitled "IN-MEMORY ASSOCIATIVE PROCESSING SYSTEM," filed Aug. 31, 2021, assigned to the assignee hereof, and expressly incorporated by reference herein.

FIELD OF TECHNOLOGY

The following relates generally to one or more systems for memory and more specifically to an in-memory associative processing system.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some systems, a host device may offload various processing tasks to an electronic device, such as an accelerator. For example, a host device may offload vector computations to the electronic device, which may use compute engines and processing techniques to perform the vector computations. This offloading of vector computations may involve communication of vectors or vector information from the host device to the electronic device, and in turn communication of results from the electronic device to the host device. Thus, the bandwidth of the electronic device may be constrained by the communication interface between the electronic device and the host device, as well as the size and serial processing of the compute engines. According to the techniques described herein, a host device may essentially increase processing bandwidth by offloading processing tasks to an associative processor memory (APM) system that uses, among other aspects, in-memory associative processing to perform vector computations in parallel.

In some examples, the APM system may support multiple different vector mapping schemes, where a vector mapping scheme may refer to an organizational scheme for writing vectors to the memory of the APM system. For example, the APM system may support a first vector mapping scheme and a second vector mapping scheme. The APM system may select between the vector mapping schemes (e.g., may select one of the vector mapping schemes) before writing vectors to the memory of the APM system according to the selected vector mapping scheme. After writing the vectors to the memory, the APM system may use associative processing to perform computational operations on the vectors according to the selected vector mapping scheme.

Features of the disclosure are initially described in the context of systems and vector computation as described with reference to FIGS. 1 and 2. Features of the disclosure are described in the context of planes, vector mapping schemes, and a process flow as described with reference to FIGS. 3-6. These and other features of the disclosure are further illustrated by and described with reference to an apparatus diagram and flowcharts that relate to an in-memory associative processing system as described with reference to FIGS. 7-12.

Figure 1:
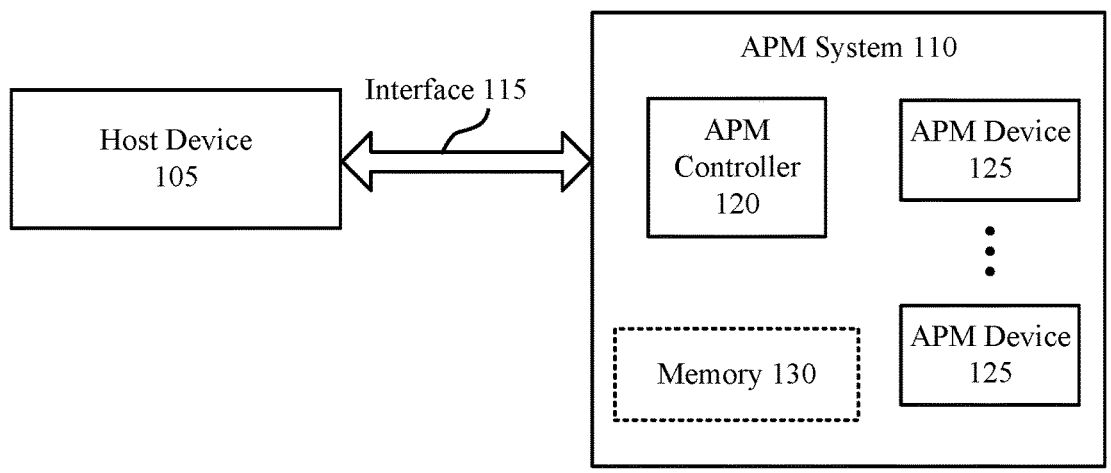
FIG. 1 illustrates an example of a system that supports in-memory associative processing in accordance with examples as disclosed herein.
Figure 1:
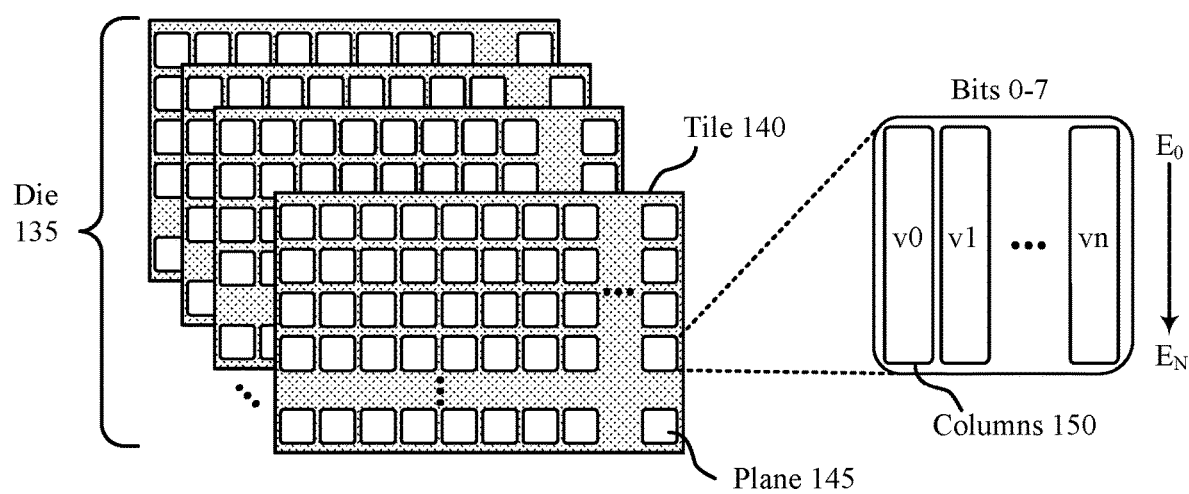

FIG. 1 illustrates an example of a system 100 that supports in-memory associative processing in accordance with examples as disclosed herein. The system 100 may include a host device 105 and an associative processing memory (APM) system 110. The host device 105 may interact with (e.g., communicate with, control) the APM system 110 as well as other components of the device that includes the APM system 110. In some examples, the host device 105 and the APM system 110 may interact over the interface 115, which may be an example of a Compute Express Link (CXL) interface or other type of interface.

In some examples, the system 100 may be included in, or coupled with, a computing device, an electronic device, a mobile computing device, or a wireless device. The device may be a portable electronic device. For example, the device may be a computer, a laptop computer, a tablet computer, a smartphone, a cellular phone, a wearable device, an internet-connected device, or the like. The host device 105 may be or include a system-on-a chip (SoC), a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In some examples, the host device 105 may be referred to as a host, a host system, or other suitable terminology.

The APM system 110 may operate as an accelerator (e.g., a high-speed processor) for the host device 105 so that the host device 105 can offload various processing tasks to the APM system 110, which may be configured to execute the processing tasks faster than the host device 105. For example, the device 105 may send a program (e.g., a set of instructions, such as Reduced Instruction Set V (RISC-V) vector instructions) to the APM system 110 for execution by the APM system 110. As part of the program, or as directed by the program, the APM system 110 may perform various computational operations on vectors (e.g., the APM system 110 may perform vector computing). A computational operation may refer to a logic operation, an arithmetic operation, or other types of operations that involve the manipulation of vectors. A vector may include one or more elements each having a respective quantity of bits. The length or size of a vector may refer to the quantity of elements in the vector and the length or size of an element may refer to the quantity of bits in the element.

The APM controller 120 may be configured to interface with the host device 105 on behalf of the APM devices 125. Upon receipt of a program from the host device 105, the APM controller 120 may parse the program and direct or otherwise prompt the APM devices 125 to perform various computational operations associated with or indicated by the program. In some examples, the APM controller 120 may retrieve (e.g., from the memory 130) the vectors for the computational operations and may communicate the vectors to the APM devices 125 for associative processing. In some examples, the APM controller 120 may indicate the vectors for the computational operations to the APM devices 125 so that the APM devices 125 can retrieve the vectors from the memory 130. In some examples, the host device 105 may provide the vectors to the APM system 110. So, the memory 130 may be configured to store vectors that are accessible by the APM controller 120, the APM device 125, the host device 105, or a combination thereof.

The vectors for computational operations at the APM devices 125 may be indicated by (or accompanied by) the program received from the host device 105 or by other control signaling (e.g., other separate control signaling) associated with the program. For example, a program that indicates a computational operation for a pair of vectors may include one or more addresses (or one or more pointers to one or more addresses) of the memory 130 where the vectors are stored. Although shown included in the APM system 110, the memory 130 may be external to, but nonetheless coupled with, the APM system 110. Although shown as a single component, the functionality of memory 130 may be provided by multiple memories 130.

The APM devices 125 may include memory cells, such as content-addressable memory cells (CAMs) that are configured to store vectors (e.g., vector operands, vector results) associated with computational operations. A vector operand may be a vector that is an operand for a computational operation (e.g., a vector operand may be a vector upon which the computation operation is executed). A vector result may be a vector that results from a vector computation.

The APM system 110 may be configured to store information, such as truth tables, for various computational operations, where information (e.g., a truth table) for a given computational operation may indicate results of the computational operation for various combinations of logic values. For example, the APM system 110 may store information (e.g., one or more truth tables) for logic operations (e.g., AND operations, OR operations, XOR operations, NOT operations, NAND operations, NOR operations, XNOR operations) as well as arithmetic operations (e.g., addition operations, subtraction operations), among other types of operations. Memory cells that store information (e.g., one or more truth tables) for a computational operation may store the various combinations of logic values for the operands of the computational operation as well as the corresponding results and carry bits, if applicable, for each combination of logic values. The APM system 110 may store truth tables for associative processing in one or more memories (e.g., in one or more on-die mask ROM(s)) which may be coupled with or included in the APM system 110. For example, the truth tables may be stored in the memory 130, in local memories of the APM devices 125, or both. In either example, an APM device 125 may cache common instructions on-device (e.g., instead of fetching them or receiving them).

At least some APM devices 125, if not each APM device 125, may use associative processing to perform computational operations on the vectors stored in that APM device 125. Unlike serial processing (where vectors are moved back and forth between a processor and a memory), associative processing may involve searching and writing vectors in-memory (also referred to as "in-situ"), which may allow for parallelism that increases processing bandwidth. Performance of computational operations in-situ may also allow the system 100 to, among other advantages, avoid the bottleneck at the interface between the host device 105 and the APM system 110, which may reduce latency and power consumption compared to other processing techniques, such as serial processing. Associative processing may also be referred to as associative computing or other suitable terminology.

In some examples, an APM device 125 that uses associative processing to perform a computational operation may leverage information, such as a truth table, to execute the computational operation in a bit-wise manner using, for example, a "search and write" technique. For example, if the APM device 125 includes CAM cells that store vector operands for a computational operation, the APM device 125 may search the CAM cells for bits of the vector operands that match an entry of the truth table corresponding to that computational operation, determine the result of the computational operational for the bits based on the matching entry of the truth table, and write the result back in the content-addressable memory. The APM device 125 may then proceed to the next significant bits for the vectors and use associative processing to perform the computational operation on those bits. In some examples, the computational operation for bits may involve a carry bit that was determined as part of the computational operation on less significant bits.

Each APM device 125 may include one or more dies 135, which may also be referred to as memory dies, semiconductor dies, or other suitable terminology. A die 135 may include multiple tiles 140, which in turn may each include multiple planes 145. In some examples, the tiles 140 may be configured such that a single plane 145 per tile is operable or activatable at a time (e.g., one plane per tile may perform associative computing at a time). However, any quantity of tiles 140 may be active at a time (e.g., any quantity of tiles may be performing associative computing at a time). Thus, the tiles 140 may be operated in parallel, which may increase the quantity of computational operations that can be performed during a time interval, which in turn may increase the bandwidth of an APM device 125 relative to other different techniques. Use of multiple APM devices 125, as opposed to a single APM device 125, may further increase the bandwidth of the APM system 110 relative to other systems. Each APM device 125 may include a local controller or logic that controls the operations of that APM device 125.

Each plane 145 may include a memory array that includes memory cells, such as CAM cells. The memory cells in a memory array may be arranged in columns and rows and may be non-volatile memory cells or volatile memory cells. A memory array that includes CAM cells may be configured to search the CAM cells by content as opposed to by address. For example, a memory array that includes CAM cells storing vectors for a computational operation may compare the logic values of the operand bits of the vectors with entries from a truth table associated with the computational operation to determine which results correspond to those logic values.

As noted, an APM device 125 may be configured to store vectors associated with computational operations in the memory cells of that APM device 125. To aid in associative processing, the vectors may be stored in a columnar manner across multiple planes. For example, given a vector v0 that has multiple n-bit (e.g., n=32) elements (denoted $E_0$ through $E_N$), an APM device 125 may divide each element into sets of contiguous bits (e.g., four sets of eight contiguous bits). The APM device 125 may store the first set of contiguous bits (e.g., the least significant set of contiguous bits) for each element of vector v0 in a first plane 145, where each row of the plane 145 stores the first set of contiguous bits for a respective element of the vector v0. Thus, in some examples, the columns 150 may store the first eight bits of each element of the vector v0 (e.g., the columns 150 may span eight columns). In a similar manner, the APM device 125 may store the next significant set of contiguous bits from each element of the vector v0 in a second plane 145. And so on and so forth for the remaining sets of contiguous bits for the vector v0. Thus, the vector v0 may be stored in a columnar manner across multiple planes. The bits of other vectors v1 through vn may be stored in a similar columnar manner across the planes 145.

Spreading vectors across multiple planes using the columnar storage technique may allow an APM device 125 to store more vectors per plane 145 relative to other techniques, which in turn may allow the APM device 125 to operate on more combinations of vectors compared to the other techniques. For example, consider a plane that is 256 rows by 256 columns. Rather than storing eight vectors with 32-bit elements across a single plane, which may limit the APM device 125 to operating on those eight vectors (absent time-consuming vector movement), the APM device 125 may store 32 vectors with 32-bit elements across four planes, which allows the APM device 125 to operate on those 32 bit vectors (e.g., one plane at a time) without performing time-consuming vector movement.

In some examples, the APM devices 125 may store vectors according to a vector mapping scheme, which may be one of multiple vector mapping schemes supported by the APM devices 125. A vector mapping scheme may refer to a scheme for mapping (and writing) vectors to planes 145 of an APM device 125. For example, an APM device 125 may support a first vector mapping scheme, referred to as vector mapping scheme 1, and a second vector mapping scheme, referred to as vector mapping scheme 2. In vector mapping scheme 1, a vector may be spread across planes of the same tile 140. In vector mapping scheme 2, a vector may be spread across planes of different tiles 140. A vector mapping scheme may also be referred to as a storage scheme, a layout scheme, or other suitable terminology.

The APM system 110 may select between the vector mapping schemes before writing vectors to the APM devices 125 according the selected vector mapping scheme. For example, the APM system 110 may select the vector mapping scheme for a set of computational operations based on the sizes of the vectors associated with the set of computational operations, the types of the computations operations (e.g., arithmetic versus logic) in the set of computational operations, a quantity of the computational operations in the set, or a combination thereof, among other aspects. In some examples, the APM system 110 may select the vector mapping scheme in response to an indication of the vector mapping scheme provided by the host device 105. For example, the host device 105 may indicate the vector mapping scheme associated with a set of instructions for the set of computational operations. After vectors have been written to the APM devices 125 according to the selected vector mapping scheme, the APM devices 125 may use associative processing to perform computational operations on the vectors in accordance with the selected vector mapping scheme. Alternatively, a compiler or pre-processor may determine the vector mapping scheme.

The associative processing techniques described herein may be implemented by logic at the APM system 110, by logic at the APM devices 125, or by logic that is distributed between the APM system 110 and the APM devices 125. The logic may include one or more controllers, access circuitry, communication circuitry, or a combination thereof, among other components and circuits. The logic may be configured to perform aspects of the techniques described herein, cause components of the APM system 110 and/or the APM devices 125 to perform aspects of the techniques described herein, or both.

Figure 2:
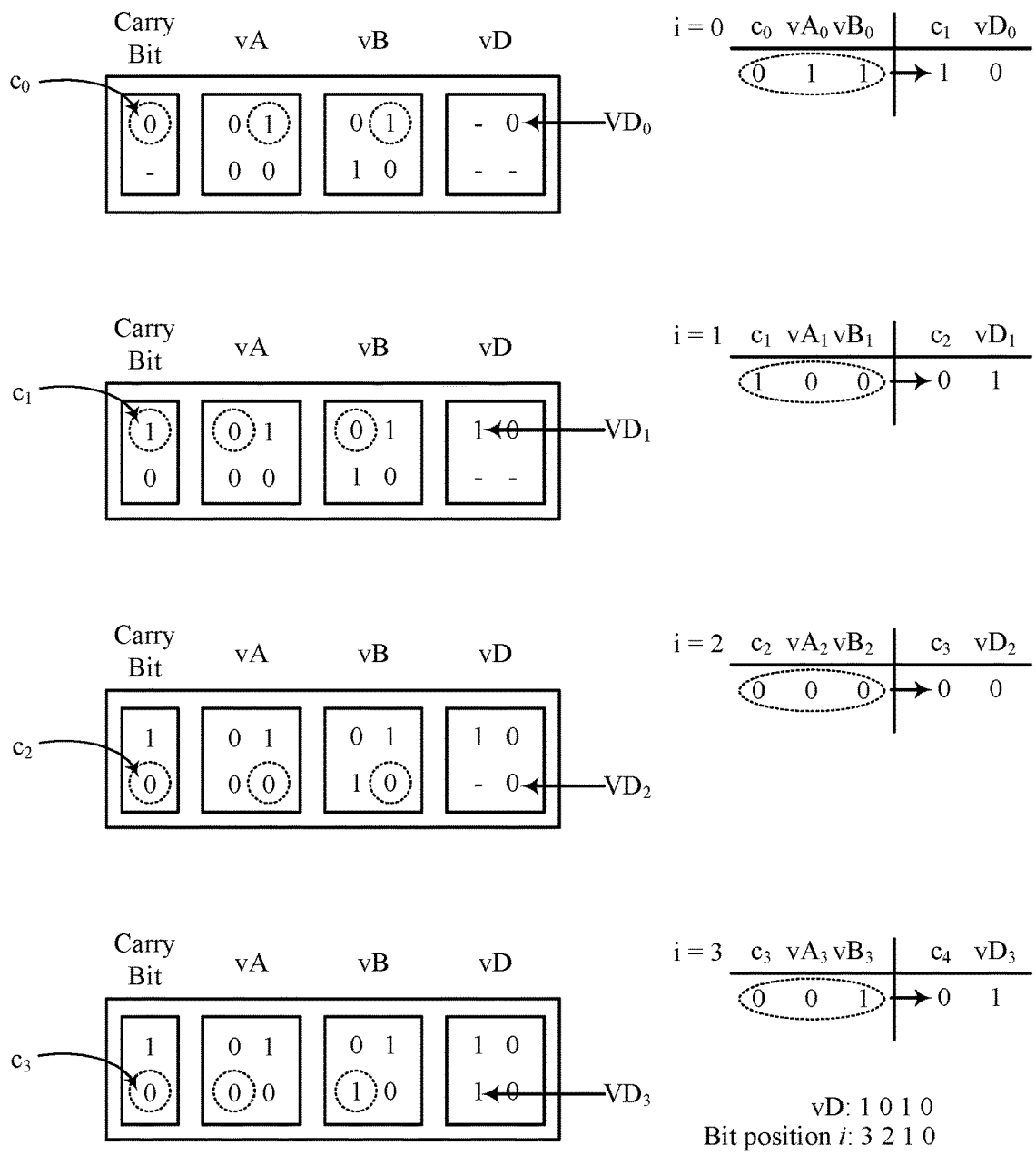
FIG. 2 illustrates an example of a vector computation using in-memory associative processing in accordance with examples as disclosed herein.

FIG. 2 illustrates an example of a vector computation 200 that supports in-memory associative processing in accordance with examples as disclosed herein. The vector computation 200 may be an example of vector addition and may be performed on operand vectors vA and vB, which may be stored in memory cells (e.g., CAM cells) of a plane of an APM device. The result of the vector addition may be vector vD. Each operand vector may include four bits (e.g., the operand vectors may include a single 4-bit element), and the position of each bit may be denoted i. The operand vectors may be stored in planes of an APM device as discussed with reference to FIG. 1 and may be associated with a set of vector instructions such as RISC-V vector instructions. The vector computation 200 may be performed using truth table 205, which may be the truth table for adding two bits and a potential carry bit. The truth table 205 may be stored in a memory coupled with or included in the APM device, and entries (e.g., rows) of the truth table 205 may be compared to operand bits of the vectors vA and vB using CAM techniques.

The provided example of using associative processing for computational operations on vectors is for illustrative purposes only and is not limiting in any way.

To perform the addition of the vector vA and the vector vB using associative processing, the APM device may retrieve (e.g., using a sequencer) entries of the truth table 205 from memory and compare (e.g., in-situ using CAM techniques) the entries with operand bits of vectors vA and vB. Upon finding a match, the APM device may write the corresponding result (e.g., vDi and carry bit $c_{i+1}$) for the matching entry to the plane storing the vectors (or a different plane) before moving on to the next significant operand bits of the vectors.

For example, for i=0, the APM device may compare the entries of the truth table 205 with the corresponding operand bits (e.g., $c_0$=0, $vA_0$=1, and $vB_0$=0) from vectors vA and vB. Upon detecting a match between the operand bits and an entry of the truth table 205, the APM device may write the result corresponding to the matching entry (e.g., $vD_0$=0 and carry bit $c_1$=1) to the plane storing the operand vectors (or a device may compare the entries from the truth table 205 with the operand bits for i=0 in a serial manner (e.g., starting with the top entry and moving down the truth table 205 one entry at a time). In some examples, the APM device may compare entries from the truth table 205 with multiple operand bits in parallel (e.g., concurrently).

After determining the result for the ith operand bits, the APM device may proceed to the next significant operand bits (which may include the carry bit i+1 carry bit determined from the ith operand bits). For instance, after determining the result for the i=0 operand bits, the APM device may proceed to the i=1 operand bits (which may include the carry bit $c_1$ determined from the i=0 operand bits). However, in some scenarios (e.g., when the computational operation is a logic operation) the APM device may perform computational operations on some or all of the operand bits in parallel.

For i=1, the APM device may compare the entries of the truth table 205 with the corresponding operand bits (e.g., $c_1$=1, $vA_1$=0, and $vB_1$=0) from vectors vA and vB. Upon detecting a match between the operand bits and an entry of the truth table 205, the APM device may write the result corresponding to the matching entry (e.g., $vD_1$=1 and carry bit $c_2$=0) to the plane storing the operand vectors (or a different plane). The APM device may compare the entries from the truth table 205 with the operand bits for i=1 in a serial manner (e.g., starting with the top entry and moving down the truth table 205 one entry at a time). After determining the result for the i=1 operand bits, the APM device may proceed to the i=2 operand bits (which may include the carry bit $c_2$ determined from the i=1 operand bits).

For i=2, the APM device may compare the entries of the truth table 205 with the corresponding operand bits (e.g., $c_2$=0, $vA_2$=0, and $vB_2$=0) from vectors vA and vB. Upon detecting a match between the operand bits and an entry of the truth table 205, the APM device may write the result corresponding to the matching entry (e.g., $vD_2$=0 and carry bit $c_3$=0) to the plane storing the operand vectors (or a different plane). The APM device may compare the entries from the truth table 205 with the operand bits for i=2 in a serial manner (e.g., starting with the top entry and moving down the truth table 205 one entry at a time). After determining the result for the i=2 operand bits, the APM device may proceed to the i=3 operand bits (which may include the carry bit $c_3$ determined from the i=2 operand bits).

For i=3, the APM device may compare the entries of the truth table 205 with the corresponding operand bits (e.g., $c_3$=0, $vA_3$=0, and $vB_3$=1) from vectors vA and vB. Upon detecting a match between the operand bits and an entry of the truth table 205, the APM device may write the result corresponding to the matching entry (e.g., $vD_3$=1 and carry bit $c_4$=0) to the plane storing the operand vectors (or a different plane). The APM device may compare the entries from the truth table 205 with the operand bits for i=3 in a serial manner (e.g., starting with the top entry and moving down the truth table 205 one entry at a time).

Thus, the APM device may use associative processing to determine that adding vA (e.g., 0b0001) and vB (e.g., 0b1001) results in vD=0b1010. After completing the addition operation, the APM device may communicate the vector vD to a host device, use the result vector vD to perform other computational operations, or a combination thereof.

An APM device may use associative processing for computational operations on vectors regardless of the vector mapping scheme. However, the communication of carry bits that arise from associative processing may vary between the vector mapping schemes. For example, if vector mapping scheme 1 is selected, certain carry bits (e.g., those that apply to the next significant set of contiguous bits) may be communicated between planes of the same tile. If vector mapping scheme 2 is selected, certain carry bits (e.g., those that apply to the next significant set of contiguous bits) may be communicated between different tiles.

Figure 3:
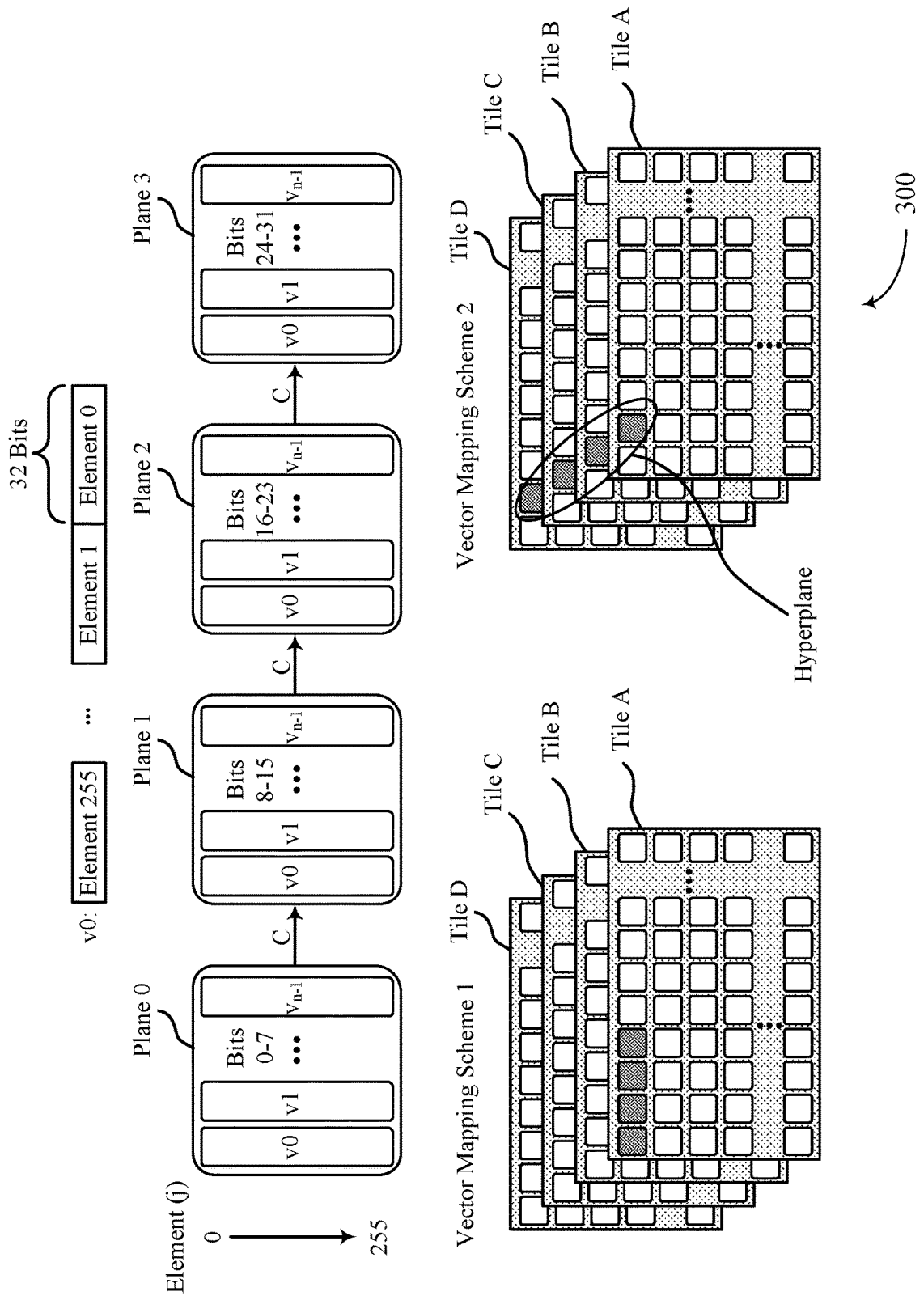
FIG. 3 illustrates an example of planes that support in-memory associative processing in accordance with examples as disclosed herein.

FIG. 3 illustrates an example of planes 300 that support in-memory associative processing in accordance with examples as disclosed herein. The planes 300 may be examples of planes 145 as described with reference to FIG. 1. Thus, the planes 300 may be configured to store vectors for computational operations that are performed using associative processing. In some examples, the planes 300 may be in the same tile, as discussed with reference to vector mapping scheme 1. In other examples, the planes 300 may be in different tiles, as discussed with reference to vector mapping scheme 2.

In the given example, n vectors with multiple (e.g., 256) multi-bit elements (e.g., 32-bit elements) are mapped to four planes. However, other quantities of these factors are contemplated and within the scope of the present disclosure.

An APM device may map and write n vectors, denoted v0 though $v_{n-1}$, to four planes. The quantity of planes to which vectors are mapped may be a function of the element length and the quantity of bits mapped to each plane. For example, the quantity of planes to which a vector is mapped may be equal to the element length divided by the quantity of bits mapped to each plane. In the given example, the quantity of planes to which the vectors are mapped is four, which is equal to the element length (e.g., 32) divided by the quantity of bits mapped to each plane (e.g., eight).

At least some if not each plane may store a set of contiguous bits from at least some if not each element of at least some if not each vector. For example, plane 0 may store contiguous bits 0-7 for each element of each vector; plane 1 may store contiguous bits 8-15 for each element of each vector; plane 2 may store contiguous bits 16-23 for each element of each vector; and plane 3 may store contiguous bits 24-31 for each element of each vector. The bits of different vectors may be stored across different columns of the planes, whereas the bits of different elements may be stored across different rows of the planes. For example, the bits from vector 0 may be stored in the first set of eight columns of each plane; the bits from vector 1 may be stored in the second set of eight columns of each plane; the bits from vector 2 may be stored in the third set of eight columns of each plane; and so on and so forth. For each vector, the bits from element 0 may be stored in the first row of a given plane; the bits from element 1 may be stored in the second row of the plane; the bits from element 2 may be stored in the third row of the plane, and so on and so forth.

So, a plane that has x rows (e.g., 256 rows) may be capable of storing vectors with x elements or fewer (vectors with length 256 or less). If a vector has more than x elements, the elements of the vector may be split across multiple planes (e.g., the elements of a vector with length 512 may be stored in two planes, with the first plane storing bits from the first 256 elements and the second plane storing bits from the second 256 elements). So, a system that uses the vector mapping schemes described herein may support vectors with larger sizes than other systems (e.g., serial processing systems) which may be constrained by the size of processing circuitry (e.g., compute engines).

Vectors may be stored according to vector mapping scheme 1 or vector mapping scheme 2. In vector mapping scheme 1, the planes to which a vector is mapped may be in the same tile. For example, plane 0 through plane 3 may be in tile A. In vector mapping scheme 2, the planes to which a vector is mapped may be in different tiles. For example, plane 0 may be in tile A, plane 1 may be in tile B, plane 2 may be in tile C, and plane 3 may be in tile D. Collectively, tiles A through D (e.g., the tiles across which a vector is spread) may be referred to a hyperplane. Both vector mapping schemes may allow an APM device to perform computational operations on multiple vectors in parallel (e.g., during partially or wholly overlapping times). For example, given h tiles, the APM device may perform h different computational operations at once.

So, in vector mapping scheme 1, an APM device may use a single tile to complete a computational operation on a vector. For instance, the APM device may use tile A to perform the computational operation on bits 0-7 of the elements in the vector, may use tile A to perform the computational operation on bits 8-15 of the elements in the vector, may use tile A to perform the computational operation on bits 16-23 of the elements in the vector, and may use tile A to perform the computational operation on bits 24-31 of the elements of the vector. If carry bits arise from the computational operations, the APM device may pass the carry bits (denoted 'C') between the planes of tile A. For example, if a carry bit results from the computational operation on bits 0-7, the APM device may pass that carry bit from plane 0 to plane 1 in tile A.

In vector mapping scheme 2, an APM device may use multiple tiles to complete a computational operation on a vector. For instance, the APM device may use tile A to perform the computational operation on bits 0-7 of the elements in the vector, may use tile B to perform the computational operation on bits 8-15 of the elements in the vector, may use tile C to perform the computational operation on bits 16-23 of the elements in the vector, and may use tile D to perform the computational operation on bits 24-31 of the elements in the vector. If carry bits arise from the computational operations, the APM device may pass the carry bits between the tiles. For example, if a carry bit results from the computational operation on bits 0-7, the APM device may pass that carry bit from tile A to tile B.

The associative processing techniques described herein may be implemented by logic at an APM system, by logic at an APM device, or by logic that is distributed between the APM system and the APM device. The logic may include one or more controllers, access circuitry, communication circuitry, or a combination thereof, among other components and circuits. The logic may be configured to perform aspects of the techniques described herein, cause components of the APM system and/or the APM device to perform aspects of the techniques described herein, or both.

Figure 4:
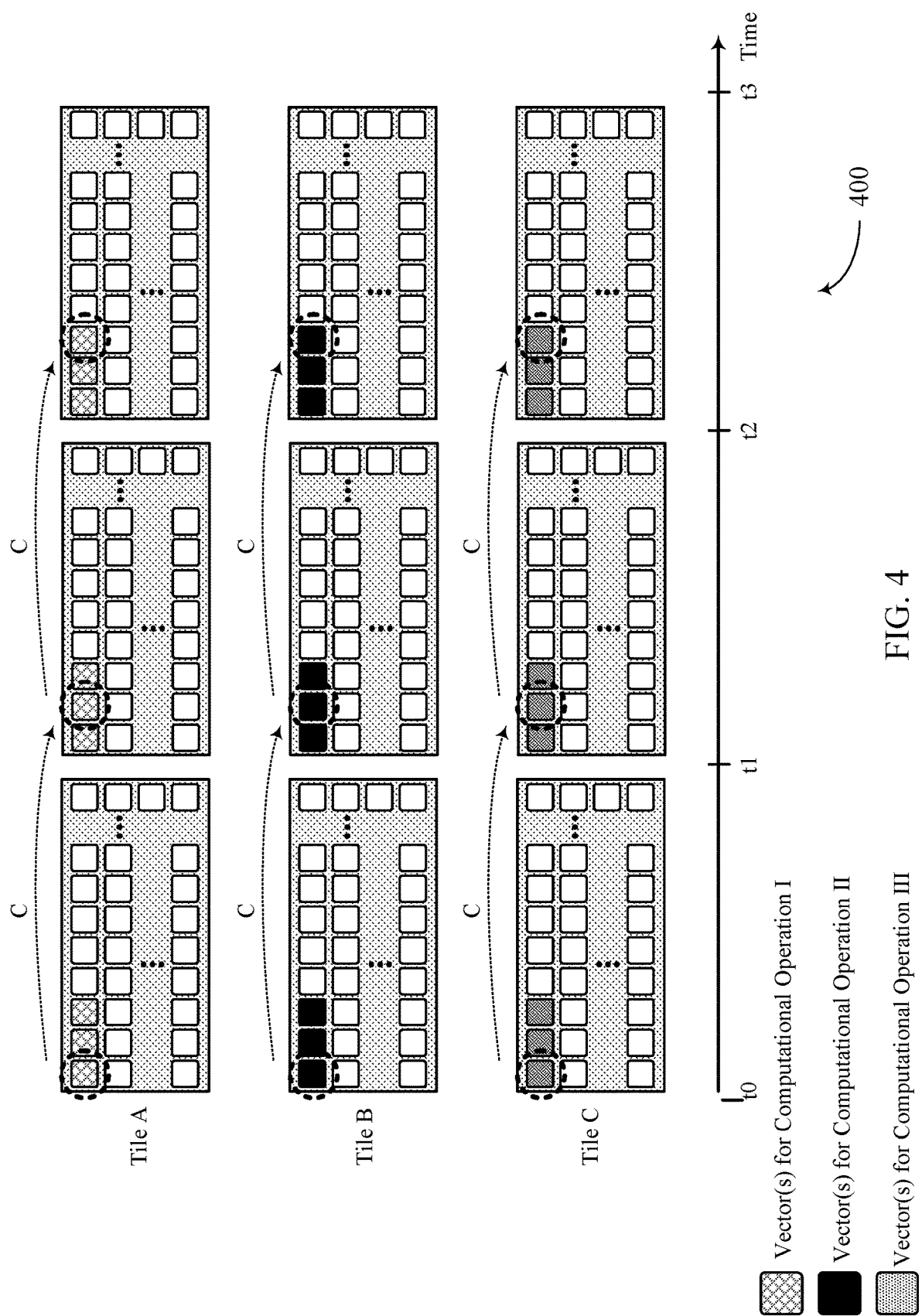
FIG. 4 illustrates an example of associative computing using tiles configured according to a vector mapping scheme in accordance with examples as disclosed herein.

FIG. 4 illustrates an example of tiles 400 that support in-memory associative processing in accordance with examples as disclosed herein. The tiles 400 may include tile A, tile B, and tile C. Each tile may store a respective set of vectors across three planes and the vectors may include n multi-bit (e.g., 24-bit) elements. For example, three planes of tile A may store, among other information, one or more vector(s) $V_I$ for a first computational operation referred to as computational operation I. Three planes of tile B may store, among other information, one or more vector(s) $V_{II}$ for a second computational operation referred to as computational operation II. And three planes of tile C may store, among other information, one or more vector(s) $V_{III}$ for a third computational operation referred to as computational operation III. Although described with reference to different vectors $V_I$, $V_{II}$, and $V_{III}$, two or more of the computational operations may involve the same vectors (e.g., different computational operations may be performed on the same vectors in parallel).

Between time t0 and time t1, tile A may perform computational operation I on bits 0-7 of the elements of the vector(s) $V_I$ for computational operation I, where the 0-7 bits of the vector(s) $V_I$ are stored in a first plane of tile A; tile B may perform computational operation II on bits 0-7 of elements of the vector(s) $V_{II}$ for computational operation II, where the 0-7 bits of the vector(s) $V_{II}$ are stored in a first plane of tile B; and tile C may perform computational operation III on bits 0-7 of elements of the vector(s) $V_{III}$ for computational operation III, where the 0-7 bits of the vectors $V_{III}$ are stored in a first plane of tile C. The computational operations may be performed using associative processing as described herein.

The results of the computational operations on the 0-7 bits may be stored in the same planes as the operand bits or in different planes. For example, the result of computational operation I on bits 0-7 of the vector(s) $V_I$ may be stored (e.g., as a vector) in the first plane of tile A. Similarly, the result of computational operation II on bits 0-7 of the vector(s) $V_{II}$ may be stored (e.g., as a vector) in the first plane of tile B. And the result of computational operation III on bits 0-7 of the vector(s) $V_{III}$ may be stored (e.g., as a vector) in the first plane of tile C.

In some examples (e.g., if the computational operations are arithmetic), a computational operation on bits 0-7 may result in a carry bit. In such a scenario, the carry bit (denoted 'C') may be communicated from the plane that stores the 0-7 bits to the plane that stores the 8-15 bits (e.g., the next significant set of contiguous bits). For example, if computational operation I on bits 0-7 of the vector(s) $V_I$ results in a carry bit, the carry bit may be passed from the first plane of tile A to the second plane of tile A (which stores the 8-15 bits for vector(s) $V_I$). Thus, in vector mapping scheme 1, carry bits may be communicated between planes of the same tile.

Between time t1 and time t2, tile A may perform computational operation I on bits 8-15 of the elements of the vector(s) $V_I$ for computational operation I, where the 8-15 bits of the vector(s) $V_I$ are stored in a second plane of tile A; tile B may perform computational operation II on bits 8-15 of elements of the vector(s) $V_{II}$ for computational operation II, where the 8-15 bits of the vector(s) $V_{II}$ are stored in a second plane of tile B; and tile C may perform computational operation III on bits 8-15 of elements of the vector(s) for computational operation III, where the 8-15 bits of the vectors(s) $V_{III}$ are stored in a second plane of tile C. The computational operations may be performed using associative processing as described herein and may be based on any carry bits received from the first planes.

The results of the computational operations on bits 8-15 may be stored in the same planes as the operand bits or in different planes. For example, the result of computational operation I on bits 8-15 of the vector(s) $V_I$ may be stored (e.g., as a vector) in the second plane of tile A. Similarly, the result of computational operation II on bits 8-15 of the vector(s) $V_{II}$ may be stored (e.g., as a vector) in the second plane of tile B. And the result of computational operation III on bits 8-15 of the vector(s) may be stored (e.g., as a vector) in the second plane of tile C.

In some examples (e.g., if the computational operations are arithmetic operations), a computational operation on bits 8-15 may result in a carry bit. In such a scenario, the carry bit may be communicated from the plane that stores bits 8-15 to the plane that stores bits 16-23 (e.g., the next significant set of contiguous bits). For example, if computational operation I on bits 8-15 of the vector(s) $V_I$ results in a carry bit, the carry bit may be passed from the second plane of tile A to the third plane of tile A (which stores bits 16-23 for the vector(s) $V_I$).

Between time t2 and time t3, tile A may perform computational operation I on bits 16-23 of the elements of the vector(s) $V_I$ for computational operation I, where the 16-23 bits of the vector(s) $V_I$ are stored in a third plane of tile A; tile B may perform computational operation II on bits 16-23 of elements of the vector(s) $V_{II}$ for computational operation II, where the 16-23 bits of the vector(s) $V_{II}$ are stored in a third plane of tile B; and tile C may perform computational operation III on bits 16-23 of elements of the vector(s) $V_{III}$ for computational operation III, where the 16-23 bits of the vector(s) $V_{III}$ are stored in a third plane of tile C. The computational operations may be performed using associative processing as described herein and may be based on any carry bits received from the first planes.

The results of the computational operations on bits 16-23 may be stored in the same planes as the operand bits or in different planes. For example, the result of computational operation I on bits 16-23 of the vector(s) $V_I$ may be stored (e.g., as a vector) in the third plane of tile A. Similarly, the result of computational operation II on bits 16-23 of the vector(s) $V_{II}$ may be stored (e.g., as a vector) in the third plane of tile B. And the result of computational operation III on bits 16-23 of the vector(s) $V_{III}$ may be stored (e.g., as a vector) in the third plane of tile C.

Thus, an APM device may perform computational operations using associative processing and tiles configured according to vector mapping scheme 1. After completing the computational operations, the APM device may communicate an indication of the results of the computational operations to a host device, use the results to perform one or more additional computational operations, or both.

Vector mapping scheme 1 may allow the APM device to process longer vectors than vector mapping scheme 2. Accordingly, the APM device may select vector mapping scheme 1 instead of vector mapping scheme 2 based on the length of the vectors the APM device is to process. For example, the APM device may select vector mapping scheme 1 if a threshold amount of the vectors have a length that satisfies (e.g., is greater than) a threshold length. In some examples, the threshold length may be equal to the quantity of rows per plane.

Vector mapping scheme 1 may allow the APM device to more efficiently process arithmetic vectors than other vector mapping schemes, such as vector mapping scheme 2. Accordingly, the APM device may select vector mapping scheme 1 over vector mapping scheme 2 based on the types of computational operations the APM device is to perform. For example, the APM device may select vector mapping scheme 1 if the ratio of arithmetic operations to logic operations satisfies (e.g., is greater than) a threshold ratio. Vector mapping scheme 1 may also allow the APM device to perform multiple vector threads of execution (e.g., multiple distinct computational operations) in parallel because the tiles are not limited to executing the same instruction.

Figure 5:
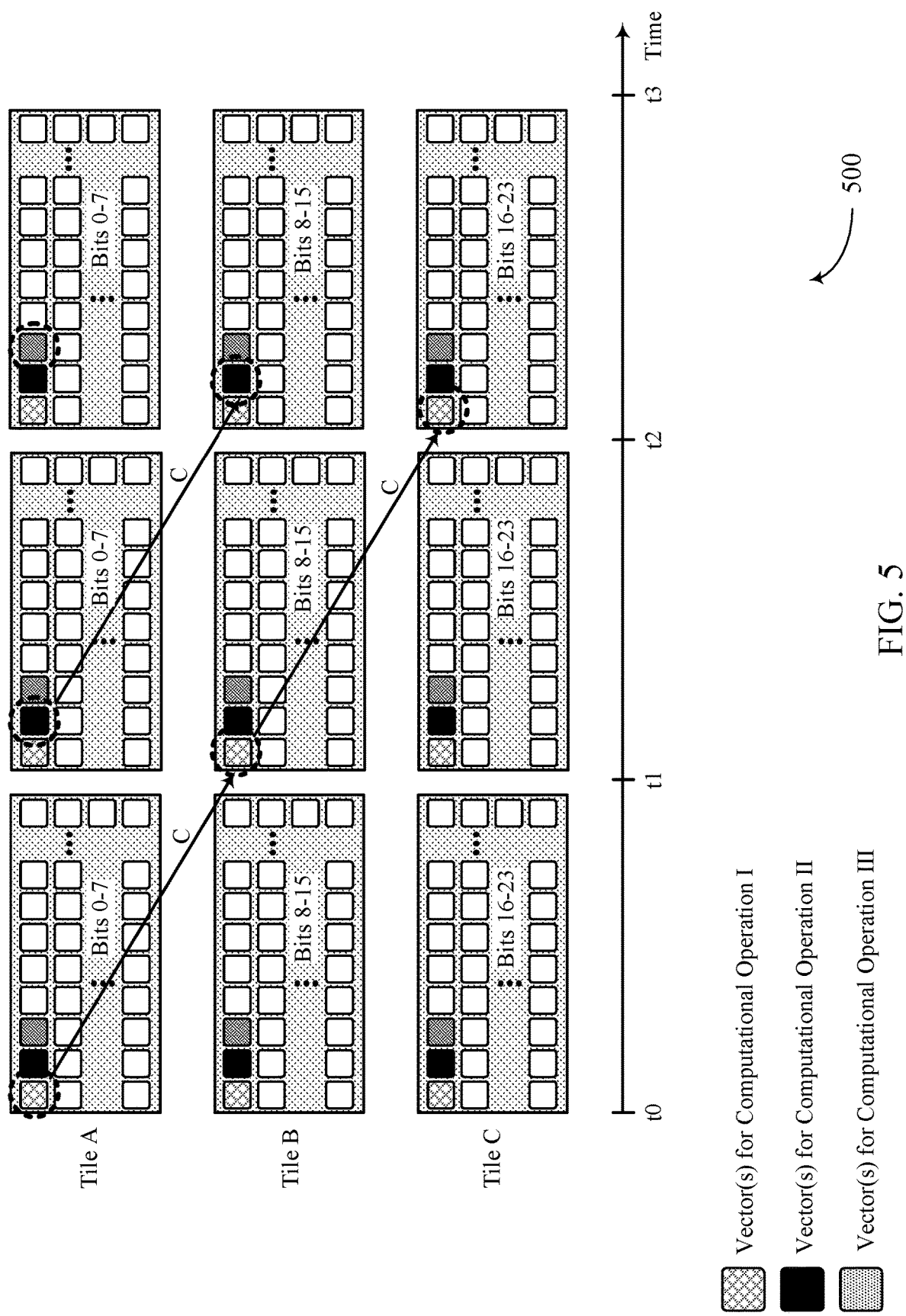
FIG. 5 illustrates an example of associative computing using tiles configured according to a vector mapping scheme in accordance with examples as disclosed herein.

FIG. 5 illustrates an example of tiles 500 that supports in-memory associative processing in accordance with examples as disclosed herein. The tiles 500 may include tile A, tile B, and tile C. Each tile may store three different sets of vectors across three different planes and the vectors may include n multi-bit (e.g., 24-bit) elements. For example, a first plane of tile A may store, among other information, bits 0-7 from the elements of one or more vector(s) $V_I$ for a first computational operation referred to as computational operation I; a second plane of tile A may store, among other information, bits 0-7 from the elements of one or more vector(s) $V_{ii}$ for a second computational operation referred to as computational operation II; and a third plane of tile A may store, among other information, bits 0-7 from the elements of one or more vector(s) $V_{III}$ for a third computational operation referred to as computational operation III. Tile B and Tile C may be similarly configured except that tile B may store bits 8-15 for the vectors and tile C may store bits 16-23 for the vectors.

Between time t0 and time t1, tile A may perform computational operation I on bits 0-7 of the elements of the vector(s) $V_I$ for computational operation I. The computational operations may be performed using associative processing as described herein. The results of computational operation I on bits 0-7 of the vector(s) $V_I$ may be stored in the same plane as the operand bits or in a different plane. For example, the result of computational operation I on bits 0-7 of the vector(s) $V_I$ may be stored (e.g., as a vector) in the first plane of tile A.

In some examples (e.g., if computational operation I is an arithmetic operation), computational operation I on bits 0-7 of the vector(s) $V_I$ may result in a carry bit. In such a scenario, the carry bit (denoted 'C') may be communicated from the tile (e.g., tile A) that stores bits 0-7 of the vector(s) $V_I$ to the tile (e.g., tile B) that stores bits 8-15 (e.g., the next significant set of contiguous bits). Thus, in vector mapping scheme 2, carry bits may be communicated between tiles (e.g., between planes of different tiles).

Between time t1 and time t2, tile A may perform computational operation II on bits 0-7 of the elements of the vector(s) $V_{II}$ for computational operation II. Further, tile B may perform computational operation I on bits 8-15 of the elements of the vector(s) $V_I$ for computational operation I. The computational operations may be performed using associative processing as described herein and may be based on any carry bits received from the other tiles.

The result of computational operation II on bits 0-7 of the vector(s) $V_{II}$ may be stored in the same plane as the operand bits or in a different plane. For example, the result of computational operation II on bits 0-7 of the vector(s) $V_{II}$ may be stored (e.g., as a vector) in the second plane of tile A. Similarly, the result of computational operation I on bits 8-15 of the vector(s) $V_I$ may be stored (e.g., as a vector) in the first plane of tile B.

In some examples (e.g., if the computational operations are arithmetic operations), the computational operations performed between t1 and t2 may result in one or more carry bits. For example, computational operation II on bits 0-7 of the vector(s) $V_{II}$ may result in a carry bit, computational operation I on bits 8-15 of the vector(s) $V_I$ may result in a carry bit, or both. In such a scenario, the carry bit from computational operation II may be communicated from the tile (e.g., tile A) that stores bits 0-7 of the vector(s) $V_{II}$ to the tile (e.g., tile B) that stores bits 8-15 of the vector(s) $V_{II}$; the carry bit from computational operation I may be communicated from the tile (e.g., tile B) that stores bits 8-15 of the vector(s) $V_I$ to the tile (e.g., tile C) that stores bits 16-23 of the vector(s) $V_I$, or both.

Between time t2 and time t3, tile A may perform computational operation III on bits 0-7 of the elements of the vector(s) $V_{III}$ for computational operation III. Further, tile B may perform computational operation II on bits 8-15 of the elements of the vector(s) $V_{II}$ for computational operation II. And tile C may perform computational operation I on bits 16-23 of the elements of the vector(s) $V_I$ for computational operation I. The computational operations may be performed using associative processing as described herein and may be based on any carry bits received from other tiles.

The results of computational operation III on bits 0-7 of the vector(s) $V_{III}$ may be stored in the same plane as the operand bits or in a different plane. For example, the result of computational operation III on bits 0-7 of the vector(s) $V_{III}$ may be stored (e.g., as a vector) in the third plane of tile A. Similarly, the result of computational operation II on bits 8-15 of the vector(s) $V_{II}$ may be stored (e.g., as a vector) in the second plane of tile B. And the result of computational operation I on bits 16-23 of the vector(s) $V_I$ may be stored (e.g., as a vector) in the first plane of tile C.

Thus, an APM device may perform computational operations using associative processing and tiles configured according to vector mapping scheme 2. After completing the computational operations, the APM device may communicate an indication of the results of the computational operations to a host device, use the results to perform one or more additional computational operations, or both.

Vector mapping scheme 2 may allow the APM device to stagger (or "pipeline") computational operations in a manner that is unsupported by vector mapping scheme 1, and thus may be more efficient for certain processing tasks. However, vector mapping scheme 2 may support smaller vector lengths than vector mapping scheme 1. Accordingly, the APM device may select vector mapping scheme 2 based on the length of the vectors the APM device is to process. For example, the APM device may select vector mapping scheme 2 if a threshold amount of the vectors have a length that satisfies (e.g., is less than) a threshold length.

Vector mapping scheme 2 may allow the APM device to more efficiently process logic vectors than other vector mapping schemes, such as vector mapping scheme 1. For example, vector mapping scheme 2 may allow the APM device to fully complete a logic operation on the vector(s) $V_I$ between time t0 and time t1 by performing the logic operation on all 24 bits of the vector(s) $V_I$ in parallel (e.g., using tiles A, B, and C). Such parallelism may be possible for logic operations because unlike arithmetic operations, logic operations may not generate carry bits. So, each tile in vector mapping scheme 2 may operate without waiting for a lower order tile to finish processing the lower order (e.g., less significant) set of contiguous bits. Accordingly, the APM device may select vector mapping scheme 1 over vector mapping scheme 2 based on the types of computational operations the APM device is to perform. For example, the APM device may select vector mapping scheme 2 if the ratio of logic operations to arithmetic operations satisfies (e.g., is greater than) a threshold ratio.

Vector mapping scheme 2 may also enable a "pipeline" of different computational operations with the same planes (in contrast to engaging different planes in each tile to create such a pipeline). For example, at time t0, plane 0 in tile A could execute computational operation 1 (e.g., logic operation 1); at time t1, plane 0 in tile A could execute computational operation 2 (e.g., logic operation 2) and plane 0 in tile B could execute computational operation 1 (e.g., logic operation 1), and so on and so forth.

Figure 6:
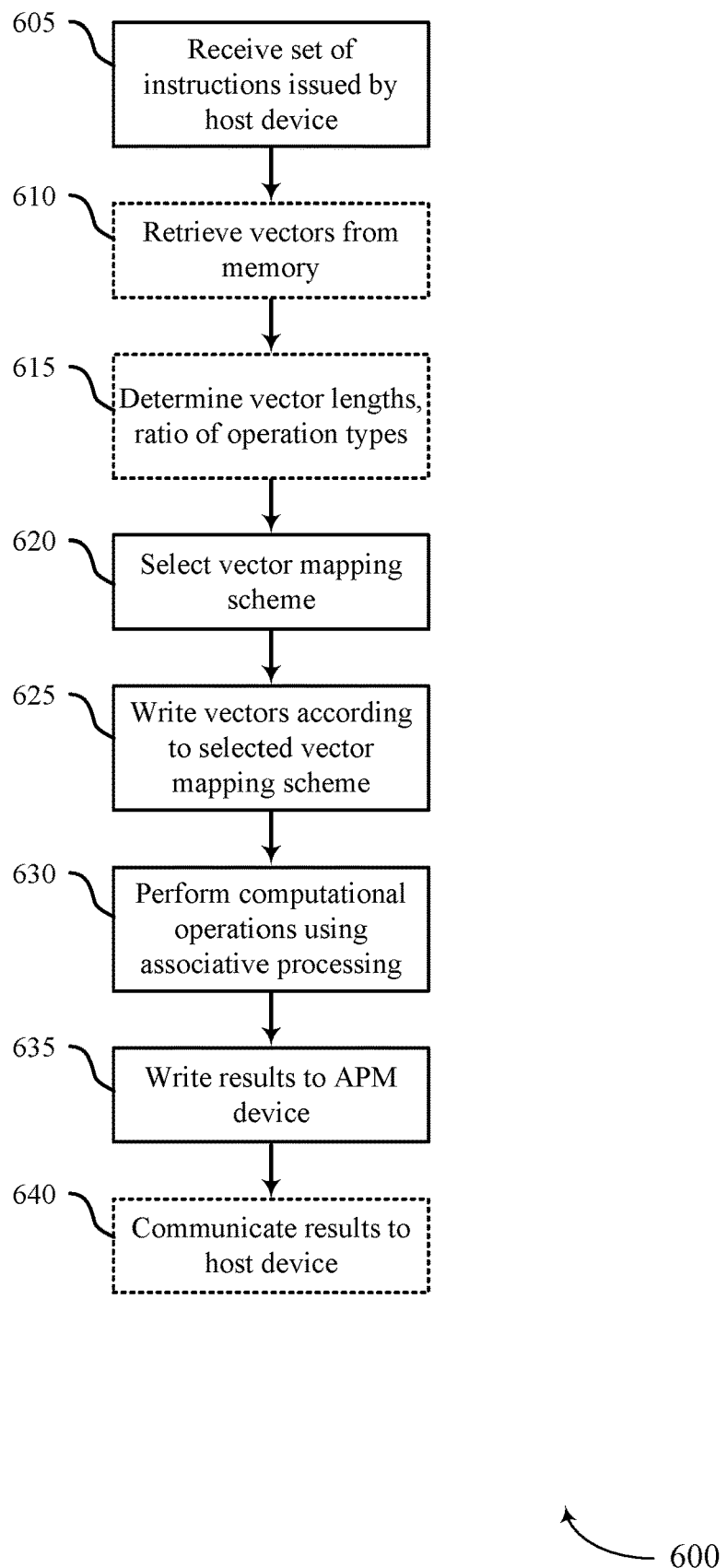
FIG. 6 illustrates an example of a process flow that supports in-memory associative processing in accordance with examples as disclosed herein.

FIG. 6 illustrates an example of a process flow 600 that supports in-memory associative processing in accordance with examples as disclosed herein. The process flow 600 may be implemented by a device such as an APM system or an APM device as described herein. The device may support multiple vector mapping schemes, such as vector mapping scheme 1 and vector mapping scheme 2. In some examples, the device may switch between the vector mapping schemes (e.g., for different sets of instructions).

At 605, the device may receive a set of instructions (e.g., a program, a set of vector instructions) issued by a host device. The set of instructions may indicate or be associated with a set of computational operations. In some examples the set of instructions may be communicated by the host device over a CXL interface. In some examples, the set of instructions may indicate memory addresses for a set of vectors that are operands for the computational operations. Alternatively, the set of instructions may be accompanied by the set of vectors. In some examples, the set of instructions may indicate one of the vector mapping schemes supported by the device.

At 610, the device may retrieve the set of vectors from a memory coupled with the device. For example, the device may retrieve the set of vectors from memory addresses of the memory that were indicated by the set of instructions. Alternatively, the device may receive the set of vectors from the host device or determine that the set of vectors is already stored in an APM die of the device.

At 615, the device may determine various characteristics of the set of computational operations, various characteristics of the set of vectors, or both, among other aspects. For example, the device may determine the lengths for the set of vectors (e.g., the quantity of elements per vector). Additionally or alternatively, the quantity of arithmetic operations in the set of computational operations, the quantity of logic operations in the set of computational operations, or both. In some examples, the device may determine a ratio of the arithmetic operations to the logic operations.

At 620, the device may select a vector mapping scheme from the set of vector mapping schemes supported by the device. For example, the device may select vector mapping scheme 1 or vector mapping scheme 2. In some examples, the device may select the vector mapping scheme indicated by the host device at 605. In other examples, the device may select the vector mapping scheme based on one or more characteristics. In some examples, the device may select vector mapping scheme 1 based on one or more of the set of vectors having a length greater than a threshold length (e.g., greater than the rows per plane). In some examples, the device may select vector mapping scheme 1 based the set of computational operations having a ratio of arithmetic operations and logic operations that satisfies a threshold ratio. In some examples, the device may select vector mapping scheme 2 based on one or more of the set of vectors having a length smaller than the threshold length. In some examples, the device may select vector mapping scheme 2 based the set of computational operations having a ratio of logic operations and arithmetic operations that satisfies a threshold ratio.

At 625, the device may write the set of vectors according to the selected vector mapping scheme. For example, if the device selected vector mapping scheme 1, the device may write the set of vectors to planes of the device according to vector mapping scheme 1 as described herein and as shown in FIGS. 3 and 4. If the device selected vector mapping scheme 2, the device may write the set of vectors to planes of the device according to vector mapping scheme 2 as described herein and as shown in FIGS. 3 and 5.

At 630, the device, may perform the set of computational operations on the set of vectors using associative processing and in accordance with the selected vector mapping scheme. For example, if the device selected vector mapping scheme 1, the device may perform the set of computational operations on the set of vectors using associative processing and in accordance with vector mapping scheme 1 as described herein and as shown in FIGS. 3 and 4. If the device selected vector mapping scheme 2, the device may perform the set of computational operations on the set of vectors using associative processing and in accordance with vector mapping scheme 2 as described herein and as shown in FIGS. 3 and 5.

At 635, the device may write the results of the set of computational operations to the planes of the device. At 640, the device may communicate some or all of the results to the host device. Additionally or alternatively, the device may use some or all of the results to perform additional processing tasks.

Thus, the device may use associative processing to perform the set of computational operations on the set of vectors.

Figure 7:
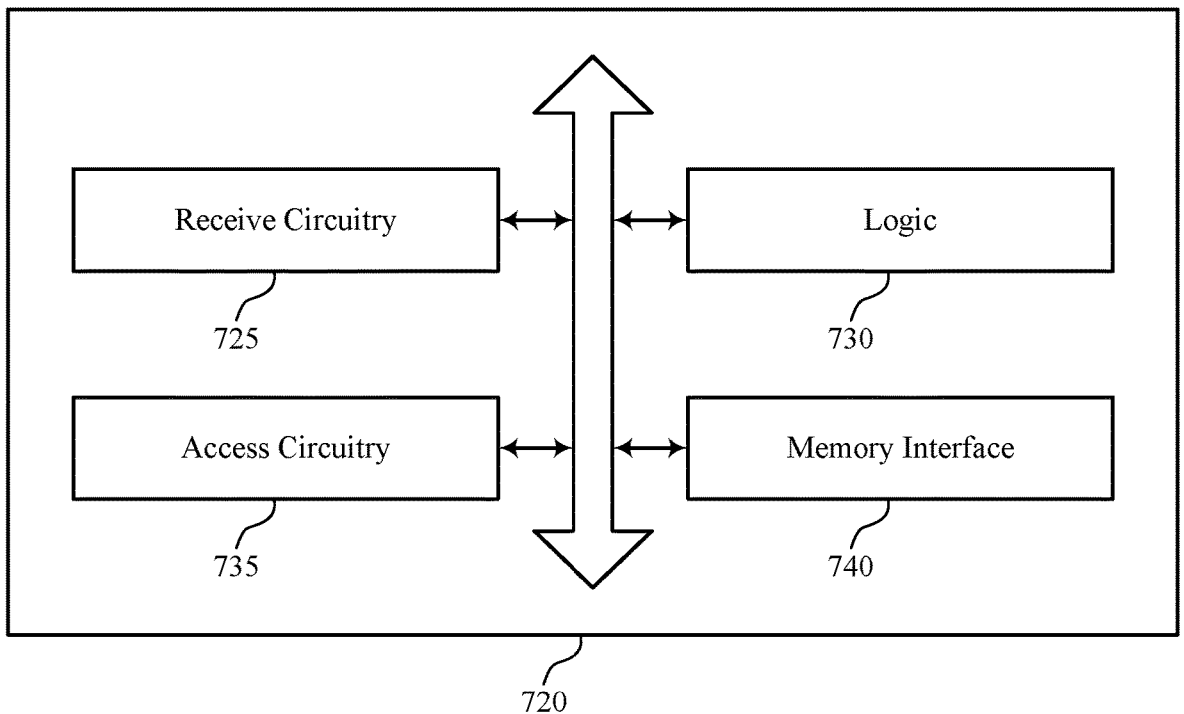
FIG. 7 shows a block diagram of a device that supports in-memory associative processing in accordance with examples as disclosed herein.

FIG. 7 shows a block diagram 700 of a device 720 that supports in-memory associative processing in accordance with examples as disclosed herein. The device 720 may be an example of aspects of a device as described with reference to FIGS. 1 through 6. The device 720, or various components thereof, may be an example of means for performing various aspects of in-memory associative processing as described herein. For example, the device 720 may include a receive circuitry 725, a logic 730, an access circuitry 735, a memory interface 740, or any combination thereof. Each of these components may communicate, directly or indirectly, with one another (e.g., via one or more buses).

The receive circuitry 725 may be configured as or otherwise support a means for receiving signaling that indicates a set of instructions from a host device, the set of instructions indicating a first vector and a second vector as operands for a computational operation. The logic 730 may be configured as or otherwise support a means for selecting, from a set of vector mapping schemes, a vector mapping scheme for performing the computational operation using associative processing. The access circuitry 735 may be configured as or otherwise support a means for writing data representative of the first vector and the second vector to a set of planes of one or more tiles based at least in part on the selected vector mapping scheme.

In some examples, the access circuitry 735 may be configured as or otherwise support a means for performing, using associative processing, the computational operation on the data representative of the first vector and the second vector. In some examples, the access circuitry 735 may be configured as or otherwise support a means for writing data representative of a third vector that is a result of the computational operation to the set of planes.

In some examples, the access circuitry 735 may be configured as or otherwise support a means for comparing data representative of bits of the first vector and the second vector with bits of memory cells that store a truth table indicating results of the computational operation for various combinations of logic values, where the performing the computational operation is based at least in part on the comparison.

In some examples, the receive circuitry 725 may be configured as or otherwise support a means for receiving an indication of the selected vector mapping scheme from the host device, where the selected vector mapping scheme is selected based at least in part on the indication.

In some examples, the logic 730 may be configured as or otherwise support a means for determining a quantity of elements of the first vector, a quantity of elements of the second vector, or both, where the selected vector mapping scheme is selected based on the quantity of elements of the first vector, the quantity of elements of the second vector, or both.

In some examples, the logic 730 may be configured as or otherwise support a means for determining a ratio of logic operations and arithmetic operations associated with the set of instructions, where the selected vector mapping scheme is selected based on the ratio of logic operations and arithmetic operations.

In some examples, to support writing, the access circuitry 735 may be configured as or otherwise support a means for writing the data representative of the first vector to different sets of columns of the set of planes than the data representative of the second vector.

In some examples, to support writing, the access circuitry 735 may be configured as or otherwise support a means for writing data representative of different sets of contiguous bits of an element of the first vector to different planes of the set of planes. In some examples, to support writing, the access circuitry 735 may be configured as or otherwise support a means for writing data representative of different sets of contiguous bits of an element of the second vector to the different planes of the set of planes.

In some examples, to support writing, the access circuitry 735 may be configured as or otherwise support a means for writing, to a first plane of the set of planes in the tile, data representative of a first set of contiguous bits of an element of the first vector and data representative of a first set of contiguous bits of an element of the second vector. In some examples, to support writing, the access circuitry 735 may be configured as or otherwise support a means for writing, to a second plane of the set of planes in the tile, data representative of a second set of contiguous bits of the element of the first vector and data representative of a second set of contiguous bits of the element of the second vector.

In some examples, to support writing, the access circuitry 735 may be configured as or otherwise support a means for writing, to a first plane of the set of planes in a first tile, data representative of a first set of contiguous bits of an element of the first vector and data representative of a first set of contiguous bits of an element of the second vector. In some examples, to support writing, the access circuitry 735 may be configured as or otherwise support a means for writing, to a second plane of the set of planes in a second tile, data representative of a second set of contiguous bits of the element of the first vector and data representative of a second set of contiguous bits of the element of the second vector.

In some examples, the memory interface 740 may be configured as or otherwise support a means for retrieving, based at least in part on the set of instructions, the first vector and the second vector from a memory coupled with the logic.

In some examples, the receive circuitry 725 may be configured as or otherwise support a means for receiving, from a host device, signaling that indicates a set of instructions indicating a vector as an operand for a computational operation, the vector including a plurality of elements each having a respective bit length. In some examples, the access circuitry 735 may be configured as or otherwise support a means for writing data representative of a first set of contiguous bits of at least one element of the plurality of elements to a first plane of a tile and data representative of a second set of contiguous bits of the at least one element to a second plane of the tile. In some examples, the access circuitry 735 may be configured as or otherwise support a means for performing, using associative processing, the computational operation based at least in part on writing the data representative of the first set of contiguous bits to the first plane and based at least in part on writing the data representative of the second set of contiguous bits to the second plane.

In some examples, the set of instructions indicates a second vector as a second operand for the computational operation, and the access circuitry 735 may be configured as or otherwise support a means for writing data representative of a first set of contiguous bits of an element of the second vector to the first plane of the tile and data representative of a second set of contiguous bits of the element of the second vector to the second plane of the tile.

In some examples, the access circuitry 735 may be configured as or otherwise support a means for writing data representative of a first set of contiguous bits of a second element of the vector to the first plane of the tile and data representative of a second set of contiguous bits of the second element of the vector to the second plane of the tile.

In some examples, to support writing, the access circuitry 735 may be configured as or otherwise support a means for writing the data representative of the first set of contiguous bits to a subset of columns of the first plane and the data representative of the second set of contiguous bits to a subset of columns of the second plane.

In some examples, the logic 730 may be configured as or otherwise support a means for selecting the vector mapping scheme based at least in part on a quantity of the plurality of elements of the vector being greater than a quantity of rows per plane of the plurality of planes. In some examples, the logic 730 may be configured as or otherwise support a means for selecting the vector mapping scheme based at least in part on the set of instructions being associated with a ratio of arithmetic operations and logic operations that is greater than a threshold ratio.

In some examples, to support performing, the access circuitry 735 may be configured as or otherwise support a means for comparing data representative of bits of the vector and bits of a second vector with bits of memory cells that store a truth table indicating results of the computational operation for various combinations of logic values. In some examples, to support performing, the access circuitry 735 may be configured as or otherwise support a means for writing data representative of a third vector that is a result of the computational operation to the set of planes based at least in part on the comparison.

In some examples, the receive circuitry 725 may be configured as or otherwise support a means for receiving, from a host device, signaling that indicates a set of instructions indicating a vector as an operand for a computational operation, the vector including a plurality of elements each having a respective bit length. In some examples, the access circuitry 735 may be configured as or otherwise support a means for writing data representative of a first set of contiguous bits of at least one element of the plurality of elements to a first plane of a first tile and data representative of a second set of contiguous bits of the at least one element to a second plane of a second tile. In some examples, the access circuitry 735 may be configured as or otherwise support a means for performing, using associative processing, the computational operation based at least in part on writing the data representative of the first set of contiguous bits to the first plane and based at least in part on writing the data representative of the second set of contiguous bits to the second plane.

In some examples, the set of instructions indicates a second vector as a second operand for the computational operation, and the access circuitry 735 may be configured as or otherwise support a means for writing data representative of a first set of contiguous bits of an element of the second vector to the first plane of the first tile and data representative of a second set of contiguous bits of the element of the second vector to the second plane of the second tile.

In some examples, the access circuitry 735 may be configured as or otherwise support a means for writing data representative of a first set of contiguous bits of a second element of the vector to the first plane of the first tile and data representative of a second set of contiguous bits of the second element to the second plane of the second tile.

In some examples, to support writing, the access circuitry 735 may be configured as or otherwise support a means for writing the data representative of the first set of contiguous bits to a subset of columns of the first plane and the data representative of the second set of contiguous bits to a subset of columns of the second plane.

In some examples, the logic 730 may be configured as or otherwise support a means for selecting the vector mapping scheme based at least in part on a quantity of the plurality of elements of the vector being greater than a quantity of rows per plane of the plurality of planes. In some examples, the logic 730 may be configured as or otherwise support a means for selecting the vector mapping scheme based at least in part on the set of instructions being associated with a ratio of arithmetic operations and logic operations that is greater than a threshold ratio.

In some examples, to support performing, the access circuitry 735 may be configured as or otherwise support a means for comparing data representative of bits of the vector and bits of a second vector with bits of memory cells that store a truth table indicating results of the computational operation for various combinations of logic values. In some examples, to support performing, the access circuitry 735 may be configured as or otherwise support a means for writing data representative of a third vector that is a result of the computational operation to the set of planes based at least in part on the comparison.

In some examples, the receive circuitry 725 may be configured as or otherwise support a means for receiving signaling that indicates a set of instructions from a host device. In some examples, the logic 730 may be configured as or otherwise support a means for selecting between a first vector mapping scheme and a second vector mapping scheme for writing vectors to planes of the device. In some examples, the access circuitry 735 may be configured as or otherwise support a means for writing, based at least in part on the selected vector mapping scheme, data representative of a first set of contiguous bits of an element of the vector to a first plane and data representative of a second set of contiguous bits of the element to a second plane. In some examples, the access circuitry 735 may be configured as or otherwise support a means for performing, based at least in writing the data representative of the first and second sets of contiguous bits, the computational operation using associative processing.

In some examples, the logic 730 may be configured as or otherwise support a means for determining a ratio of arithmetic operations and logic operations associated with the set of instructions, a length of the vector based at least in part on the plurality of elements, or both, where the selected vector mapping scheme is selected based at least in part on the ratio, the length of the vector, or both.

In some examples, the set of instructions indicates a second vector as an operand for the computational operation, and the access circuitry 735 may be configured as or otherwise support a means for writing, based at least in part on the selected vector mapping scheme, data representative of a first set of contiguous bits of an element of the second vector to the first plane and data representative of a second set of contiguous bits of the element of the second vector to the second plane.

In some examples, the access circuitry 735 may be configured as or otherwise support a means for writing, based at least in part on the selected vector mapping scheme, data representative of a first set of contiguous bits of a second element of the vector to the first plane and data representative of a second set of contiguous bits of the second element of the vector to the second plane.

In some examples, the receive circuitry 725 may be configured as or otherwise support a means for receiving, at an apparatus, signaling that indicates a set of instructions indicating a first vector and a second vector as operands for a computational operation. In some examples, the logic 730 may be configured as or otherwise support a means for selecting, from a set of vector mapping schemes, a vector mapping scheme for performing the computational operation using associative processing. In some examples, the access circuitry 735 may be configured as or otherwise support a means for writing data representative of the first vector and data representative of the second vector to a set of planes each including an array of content-addressable memory cells based at least in part on the selected vector mapping scheme.

In some examples, the receive circuitry 725 may be configured as or otherwise support a means for receiving an indication of the selected vector mapping scheme from the host device, where the selected vector mapping scheme is selected based at least in part on the indication.

In some examples, the logic 730 may be configured as or otherwise support a means for determining a quantity of elements in the first vector, a quantity of elements in the second vector, or both, where the selected vector mapping scheme is selected based on the quantity of elements in the first vector, the quantity of elements in the second vector, or both.

In some examples, the logic 730 may be configured as or otherwise support a means for determining a ratio of logic operations and arithmetic operations associated with the set of instructions, where the selected vector mapping scheme is selected based on the ratio of logic operations and arithmetic operations.

In some examples, the set of planes is in a tile, and the access circuitry 735 may be configured as or otherwise support a means for writing, to a first plane of the set of planes in the tile, data representative of a first set of contiguous bits of an element of the first vector and data representative of a first set of contiguous bits of an element of the second vector. In some examples, the set of planes is in a tile, and the access circuitry 735 may be configured as or otherwise support a means for writing to a second plane of the set of planes in the tile, data representative of a second set of contiguous bits of the element of the first vector and data representative of a second set of contiguous bits of the element of the second vector.

In some examples, the access circuitry 735 may be configured as or otherwise support a means for writing, to a first plane of the set of planes in a first tile, data representative of a first set of contiguous bits of an element of the first vector and data representative of a first set of contiguous bits of an element of the second vector. In some examples, the access circuitry 735 may be configured as or otherwise support a means for writing, to a second plane of the set of planes in a second tile, data representative of a second set of contiguous bits of the element of the first vector and data representative of a second set of contiguous bits of the element of the second vector.

In some examples, the logic 730 may include the receive circuitry 725, the access circuitry 735, and the memory interface 740, among other components and circuitry. The logic may be included in an APM system, included in an APM device, or may be distributed between the APM system and the APM device. The logic 730 may be configured to perform aspects of the techniques described herein, cause components of the APM system and/or the APM device to perform aspects of the techniques described herein, or both.

Figure 8:
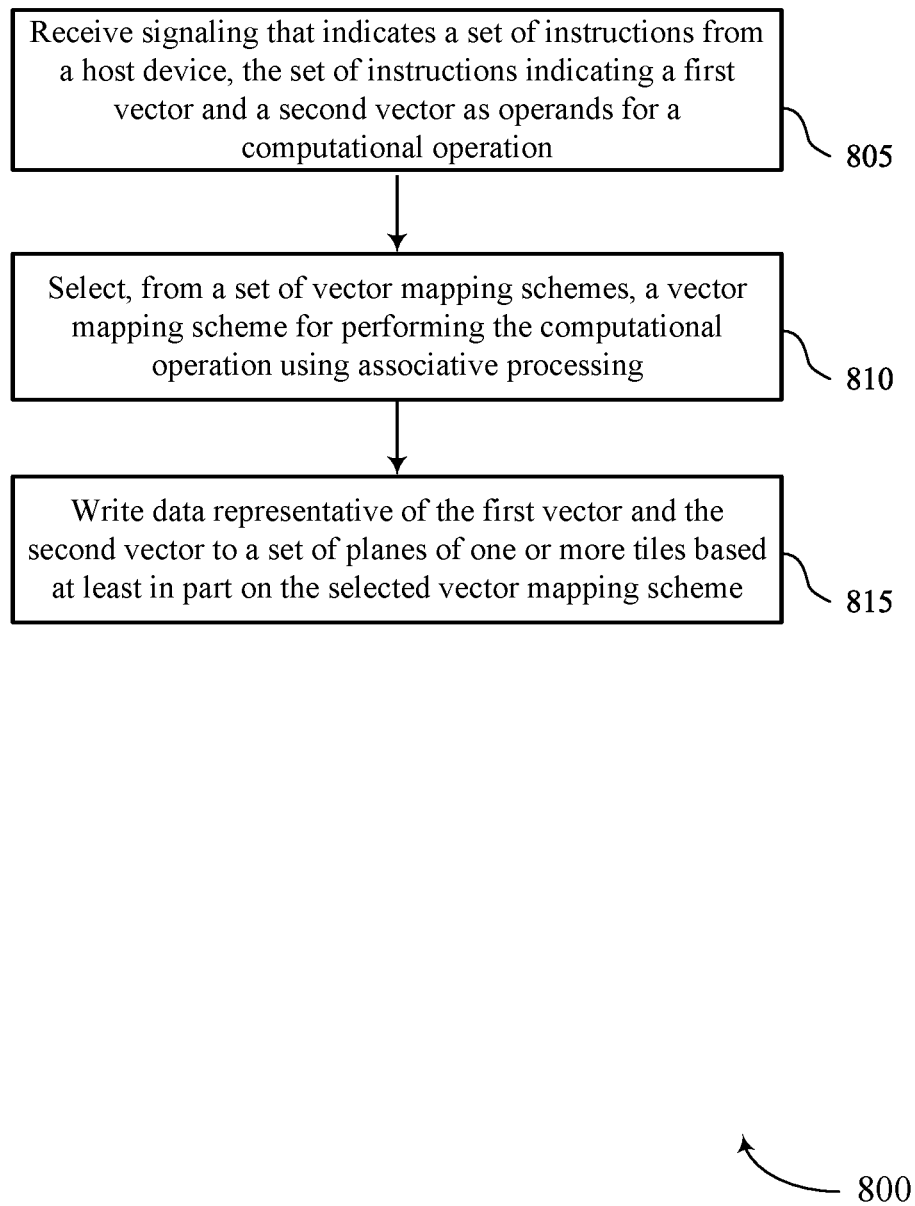
FIGS. 8 through 12 show flowcharts illustrating a method or methods that support in-memory associative processing in accordance with examples as disclosed herein.

FIG. 8 shows a flowchart illustrating a method 800 that supports in-memory associative processing in accordance with examples as disclosed herein. The operations of method 800 may be implemented by a device or its components as described herein. For example, the operations of method 800 may be performed by an APM system or an APM device as described with reference to FIGS. 1 through 7. In some examples, a device may execute a set of instructions to control the functional elements of the device to perform the described functions. Additionally or alternatively, the device may perform aspects of the described functions using special-purpose hardware.

At 805, the method may include receiving signaling that indicates a set of instructions from a host device, the set of instructions indicating a first vector and a second vector as operands for a computational operation. The operations of 805 may be performed in accordance with examples as disclosed herein. In some examples, aspects of the operations of 805 may be performed by a receive circuitry 725 as described with reference to FIG. 7.

At 810, the method may include selecting, from a set of vector mapping schemes, a vector mapping scheme for performing the computational operation using associative processing. The operations of 810 may be performed in accordance with examples as disclosed herein. In some examples, aspects of the operations of 810 may be performed by a logic 730 as described with reference to FIG. 7.

At 815, the method may include writing data representative of the first vector and the second vector to a set of planes of one or more tiles based at least in part on the selected vector mapping scheme. The operations of 815 may be performed in accordance with examples as disclosed herein. In some examples, aspects of the operations of 815 may be performed by an access circuitry 735 as described with reference to FIG. 7.

In some examples, an apparatus as described herein may perform the method 800. The apparatus may include a memory die comprising a plurality of tiles each comprising a plurality of planes, where each plane comprises a respective array of content-addressable memory cells. The apparatus may also include logic that is coupled with the memory die and that is configured to cause the apparatus to perform the methods, including the method 800, as described herein.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving signaling that indicates a set of instructions from a host device, the set of instructions indicating a first vector and a second vector as operands for a computational operation, selecting, from a set of vector mapping schemes, a vector mapping scheme for performing the computational operation using associative processing, and writing data representative of the first vector and the second vector to a set of planes of one or more tiles based at least in part on the selected vector mapping scheme.

Some examples of the method 800 and the apparatus described herein may further include operations, features, circuitry, logic, means, or instructions for performing, using associative processing, the computational operation on the data representative of the first vector and the second vector and writing data representative of a third vector that may be a result of the computational operation to the set of planes.

Some examples of the method 800 and the apparatus described herein may further include operations, features, circuitry, logic, means, or instructions for comparing data representative of bits of the first vector and the second vector with bits of content-addressable memory cells that store a truth table indicating results of the computational operation for various combinations of logic values, where the performing the computational operation may be based at least in part on the comparison.

Some examples of the method 800 and the apparatus described herein may further include operations, features, circuitry, logic, means, or instructions for receiving an indication of the selected vector mapping scheme from the host device, where the selected vector mapping scheme may be selected based at least in part on the indication.

Some examples of the method 800 and the apparatus described herein may further include operations, features, circuitry, logic, means, or instructions for determining a quantity of elements of the first vector, a quantity of elements of the second vector, or both, where the selected vector mapping scheme may be selected based on the quantity of elements of the first vector, the quantity of elements of the second vector, or both.

Some examples of the method 800 and the apparatus described herein may further include operations, features, circuitry, logic, means, or instructions for determining a ratio of logic operations and arithmetic operations associated with the set of instructions, where the selected vector mapping scheme may be selected based on the ratio of logic operations and arithmetic operations.

In some examples of the method 800 and the apparatus described herein, writing may include operations, features, circuitry, logic, means, or instructions for writing the data representative of the first vector to different sets of columns of the set of planes than the data representative of the second vector.

In some examples of the method 800 and the apparatus described herein, writing may include operations, features, circuitry, logic, means, or instructions for writing data representative of different sets of contiguous bits of an element of the first vector to different planes of the set of planes and writing data representative of different sets of contiguous bits of an element of the second vector to the different planes of the set of planes.

In some examples of the method 800 and the apparatus described herein, writing may include operations, features, circuitry, logic, means, or instructions for writing, to a first plane of the set of planes in the tile, data representative of a first set of contiguous bits of an element of the first vector and data representative of a first set of contiguous bits of an element of the second vector and writing, to a second plane of the set of planes in the tile, data representative of a second set of contiguous bits of the element of the first vector and data representative of a second set of contiguous bits of the element of the second vector.

In some examples of the method 800 and the apparatus described herein, writing may include operations, features, circuitry, logic, means, or instructions for writing, to a first plane of the set of planes in a first tile, data representative of a first set of contiguous bits of an element of the first vector and data representative of a first set of contiguous bits of an element of the second vector and writing, to a second plane of the set of planes in a second tile, data representative of a second set of contiguous bits of the element of the first vector and data representative of a second set of contiguous bits of the element of the second vector.

In some examples of the method 800 and the apparatus described herein, retrieving, based at least in part on the set of instructions, the first vector and the second vector from a memory coupled with the logic.

Figure 9:
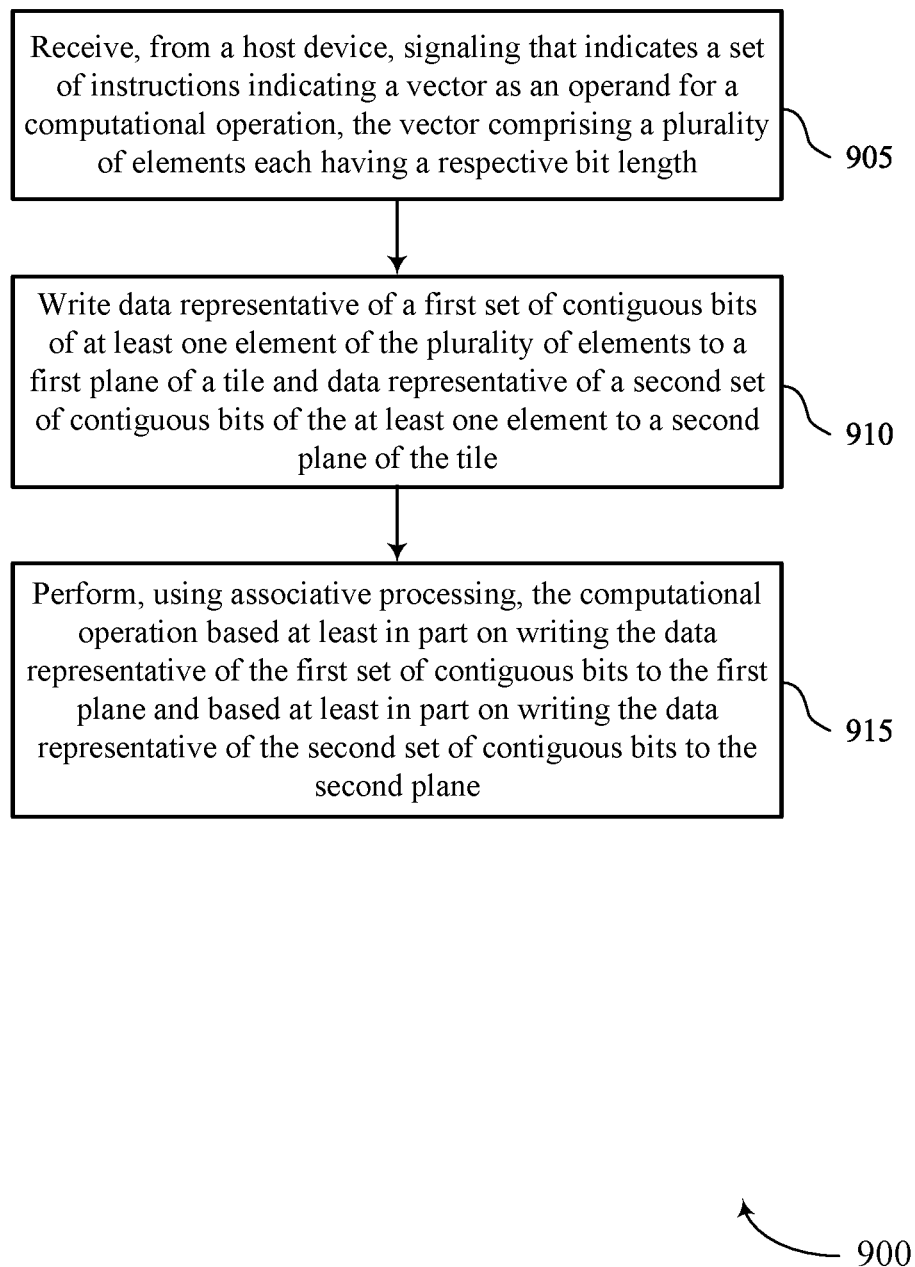

FIG. 9 shows a flowchart illustrating a method 900 that supports in-memory associative processing in accordance with examples as disclosed herein. The operations of method 900 may be implemented by a device or its components as described herein. For example, the operations of method 900 may be performed by an APM system or an APM device as described with reference to FIGS. 1 through 7. In some examples, a device may execute a set of instructions to control the functional elements of the device to perform the described functions. Additionally or alternatively, the device may perform aspects of the described functions using special-purpose hardware.

At 905, the method may include receiving, from a host device, signaling that indicates a set of instructions indicating a vector as an operand for a computational operation, the vector including a plurality of elements each having a respective bit length. The operations of 905 may be performed in accordance with examples as disclosed herein. In some examples, aspects of the operations of 905 may be performed by a receive circuitry 725 as described with reference to FIG. 7.

At 910, the method may include writing data representative of a first set of contiguous bits of at least one element of the plurality of elements to a first plane of a tile and data representative of a second set of contiguous bits of the at least one element to a second plane of the tile. The operations of 910 may be performed in accordance with examples as disclosed herein. In some examples, aspects of the operations of 910 may be performed by an access circuitry 735 as described with reference to FIG. 7.

At 915, the method may include performing, using associative processing, the computational operation based at least in part on writing the data representative of the first set of contiguous bits to the first plane and based at least in part on writing the data representative of the second set of contiguous bits to the second plane. The operations of 915 may be performed in accordance with examples as disclosed herein. In some examples, aspects of the operations of 915 may be performed by an access circuitry 735 as described with reference to FIG. 7.

In some examples, an apparatus as described herein may perform the method 900. The apparatus may include a memory die comprising a plurality of tiles each comprising a plurality of planes, where each plane comprises a respective array of content-addressable memory cells. The apparatus may also include logic that is coupled with the memory die and that is configured to cause the apparatus to perform the methods, including the method 900, as described herein.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving, from a host device, signaling that indicates a set of instructions indicating a vector as an operand for a computational operation, the vector including a plurality of elements each having a respective bit length, writing data representative of a first set of contiguous bits of at least one element of the plurality of elements to a first plane of a tile and data representative of a second set of contiguous bits of the at least one element to a second plane of the tile, and performing, using associative processing, the computational operation based at least in part on writing the data representative of the first set of contiguous bits to the first plane and based at least in part on writing the data representative of the second set of contiguous bits to the second plane.

In some examples of the method 900 and the apparatus described herein, the set of instructions indicates a second vector as a second operand for the computational operation and the method, apparatuses, and non-transitory computer-readable medium may include further operations, features, circuitry, logic, means, or instructions for writing data representative of a first set of contiguous bits of an element of the second vector to the first plane of the tile and data representative of a second set of contiguous bits of the element of the second vector to the second plane of the tile.

Some examples of the method 900 and the apparatus described herein may further include operations, features, circuitry, logic, means, or instructions for writing data representative of a first set of contiguous bits of a second element of the vector to the first plane of the tile and data representative of a second set of contiguous bits of the second element of the vector to the second plane of the tile.

In some examples of the method 900 and the apparatus described herein, writing may include operations, features, circuitry, logic, means, or instructions for writing the data representative of the first set of contiguous bits to a subset of columns of the first plane and the data representative of the second set of contiguous bits to a subset of columns of the second plane.

In some examples of the method 900 and the apparatus described herein, and the method, apparatuses, and non-transitory computer-readable medium may include further operations, features, circuitry, logic, means, or instructions for selecting the vector mapping scheme based at least in part on a quantity of the plurality of elements of the vector being greater than a quantity of rows per plane of the plurality of planes.

In some examples of the method 900 and the apparatus described herein, and the method, apparatuses, and non-transitory computer-readable medium may include further operations, features, circuitry, logic, means, or instructions for selecting the vector mapping scheme based at least in part on the set of instructions being associated with a ratio of arithmetic operations and logic operations that may be greater than a threshold ratio.

In some examples of the method 900 and the apparatus described herein, performing may include operations, features, circuitry, logic, means, or instructions for comparing data representative of bits of the vector and bits of a second vector with bits of content-addressable memory cells that store a truth table indicating results of the computational operation for various combinations of logic values and writing data representative of a third vector that may be a result of the computational operation to the set of planes based at least in part on the comparison.

Figure 10:
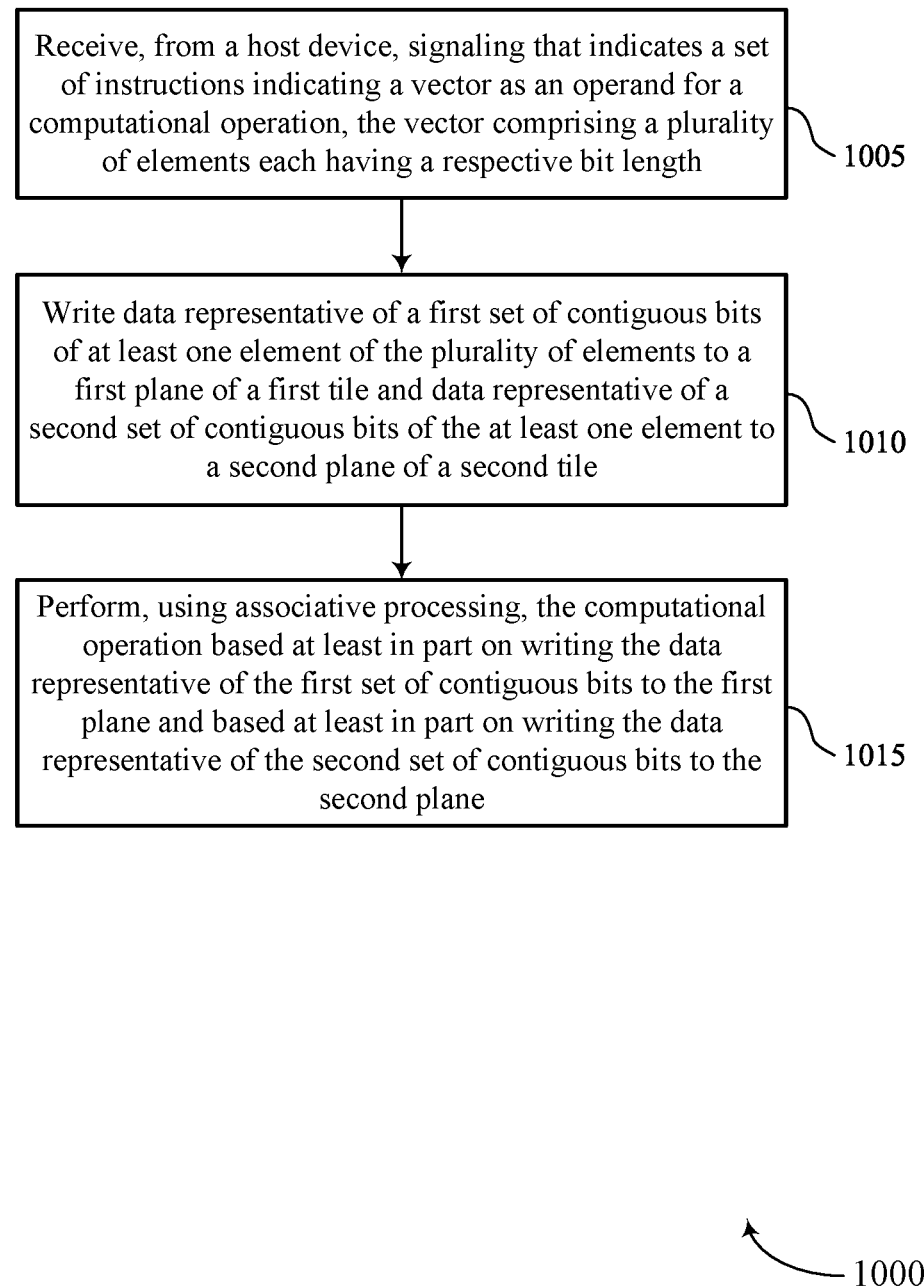

FIG. 10 shows a flowchart illustrating a method 1000 that supports in-memory associative processing in accordance with examples as disclosed herein. The operations of method 1000 may be implemented by a device or its components as described herein. For example, the operations of method 1000 may be performed by an APM system or an APM device as described with reference to FIGS. 1 through 7. In some examples, a device may execute a set of instructions to control the functional elements of the device to perform the described functions. Additionally or alternatively, the device may perform aspects of the described functions using special-purpose hardware.

At 1005, the method may include receiving, from a host device, signaling that indicates a set of instructions indicating a vector as an operand for a computational operation, the vector including a plurality of elements each having a respective bit length. The operations of 1005 may be performed in accordance with examples as disclosed herein. In some examples, aspects of the operations of 1005 may be performed by a receive circuitry 725 as described with reference to FIG. 7.

At 1010, the method may include writing data representative of a first set of contiguous bits of at least one element of the plurality of elements to a first plane of a first tile and data representative of a second set of contiguous bits of the at least one element to a second plane of a second tile. The operations of 1010 may be performed in accordance with examples as disclosed herein. In some examples, aspects of the operations of 1010 may be performed by an access circuitry 735 as described with reference to FIG. 7.

At 1015, the method may include performing, using associative processing, the computational operation based at least in part on writing the data representative of the first set of contiguous bits to the first plane and based at least in part on writing the data representative of the second set of contiguous bits to the second plane. The operations of 1015 may be performed in accordance with examples as disclosed herein. In some examples, aspects of the operations of 1015 may be performed by an access circuitry 735 as described with reference to FIG. 7.

In some examples, an apparatus as described herein may perform the method 1000. The apparatus may include a memory die comprising a plurality of tiles each comprising a plurality of planes, where each plane comprises a respective array of content-addressable memory cells. The apparatus may also include logic that is coupled with the memory die and that is configured to cause the apparatus to perform the methods, including the method 1000, as described herein.

In some examples, an apparatus as described herein may perform a method or methods, such as the method 1000. The apparatus may include, features, circuitry, logic, means, or instructions (e.g., a non-transitory computer-readable medium storing instructions executable by a processor) for receiving, from a host device, signaling that indicates a set of instructions indicating a vector as an operand for a computational operation, the vector including a plurality of elements each having a respective bit length, writing data representative of a first set of contiguous bits of at least one element of the plurality of elements to a first plane of a first tile and data representative of a second set of contiguous bits of the at least one element to a second plane of a second tile, and performing, using associative processing, the computational operation based at least in part on writing the data representative of the first set of contiguous bits to the first plane and based at least in part on writing the data representative of the second set of contiguous bits to the second plane.

In some examples of the method 1000 and the apparatus described herein, the set of instructions indicates a second vector as a second operand for the computational operation and the method, apparatuses, and non-transitory computer-readable medium may include further operations, features, circuitry, logic, means, or instructions for writing data representative of a first set of contiguous bits of an element of the second vector to the first plane of the first tile and data representative of a second set of contiguous bits of the element of the second vector to the second plane of the second tile.

Some examples of the method 1000 and the apparatus described herein may further include operations, features, circuitry, logic, means, or instructions for writing data representative of a first set of contiguous bits of a second element of the vector to the first plane of the first tile and data representative of a second set of contiguous bits of the second element to the second plane of the second tile.

In some examples of the method 1000 and the apparatus described herein, writing may include operations, features, circuitry, logic, means, or instructions for writing the data representative of the first set of contiguous bits to a subset of columns of the first plane and the data representative of the second set of contiguous bits to a subset of columns of the second plane.

In some examples of the method 1000 and the apparatus described herein, and the method, apparatuses, and non-transitory computer-readable medium may include further operations, features, circuitry, logic, means, or instructions for selecting the vector mapping scheme based at least in part on a quantity of the plurality of elements of the vector being greater than a quantity of rows per plane of the plurality of planes.

In some examples of the method 1000 and the apparatus described herein, and the method, apparatuses, and non-transitory computer-readable medium may include further operations, features, circuitry, logic, means, or instructions for selecting the vector mapping scheme based at least in part on the set of instructions being associated with a ratio of arithmetic operations and logic operations that may be greater than a threshold ratio.

In some examples of the method 1000 and the apparatus described herein, performing may include operations, features, circuitry, logic, means, or instructions for comparing data representative of bits of the vector and bits of a second vector with bits of content-addressable memory cells that store a truth table indicating results of the computational operation for various combinations of logic values and writing data representative of a third vector that may be a result of the computational operation to the set of planes based at least in part on the comparison.

Figure 11:
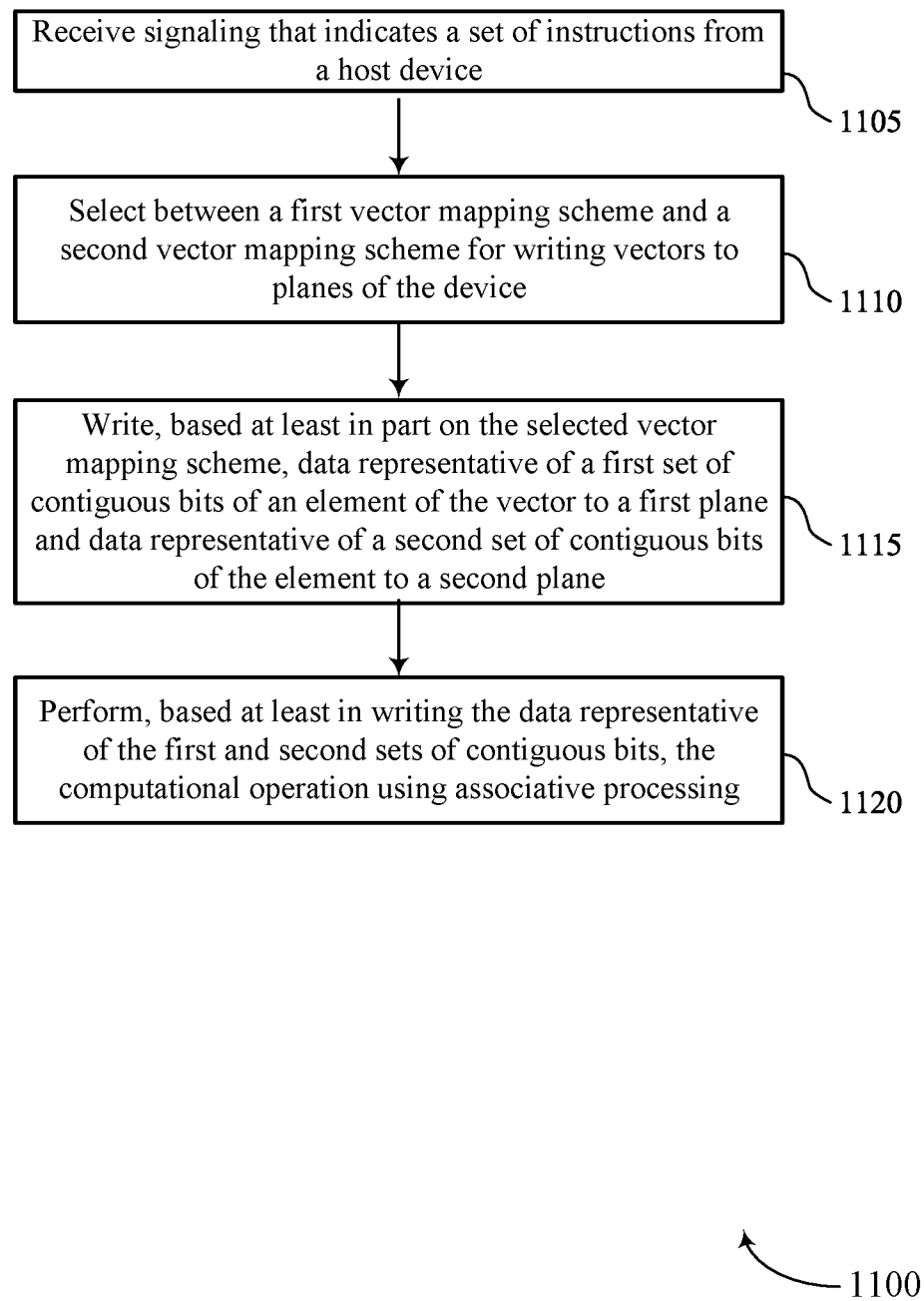

FIG. 11 shows a flowchart illustrating a method 1100 that supports in-memory associative processing in accordance with examples as disclosed herein. The operations of method 1100 may be implemented by a device or its components as described herein. For example, the operations of method 1100 may be performed by a system 100 as described with reference to FIGS. 1 through 7. In some examples, a device may execute a set of instructions to control the functional elements of the device to perform the described functions. Additionally or alternatively, the device may perform aspects of the described functions using special-purpose hardware.

At 1105, the method may include receiving signaling that indicates a set of instructions from a host device. The operations of 1105 may be performed in accordance with examples as disclosed herein. In some examples, aspects of the operations of 1105 may be performed by a receive circuitry 725 as described with reference to FIG. 7.

At 1110, the method may include selecting between a first vector mapping scheme and a second vector mapping scheme for writing vectors to planes of the device. The operations of 1110 may be performed in accordance with examples as disclosed herein. In some examples, aspects of the operations of 1110 may be performed by a logic 730 as described with reference to FIG. 7.

At 1115, the method may include writing, based at least in part on the selected vector mapping scheme, data representative of a first set of contiguous bits of an element of the vector to a first plane and data representative of a second set of contiguous bits of the element to a second plane. The operations of 1115 may be performed in accordance with examples as disclosed herein. In some examples, aspects of the operations of 1115 may be performed by an access circuitry 735 as described with reference to FIG. 7.

At 1120, the method may include performing, based at least in writing the data representative of the first and second sets of contiguous bits, the computational operation using associative processing. The operations of 1120 may be performed in accordance with examples as disclosed herein. In some examples, aspects of the operations of 1120 may be performed by an access circuitry 735 as described with reference to FIG. 7.

In some examples, an apparatus as described herein may perform the method 1100. The apparatus may include a host device that is configured to transmit signaling that indicates a set of instructions indicating a vector as an operand for a computational operation, the vector comprising a plurality of elements each having a respective bit length. The apparatus may also include a device that is coupled with the host device and that is configured to perform associative processing, the device comprising a plurality of tiles that each comprise a plurality of planes, where each plane comprises a respective array of content-addressable memory cells. The apparatus may also include logic that is coupled with the device and that is configured to cause the device to perform the methods, including the method 1100, as described herein.

In some examples, an apparatus as described herein may perform a method or methods, such as the method 1100. The apparatus may include, features, circuitry, logic, means, or instructions (e.g., a non-transitory computer-readable medium storing instructions executable by a processor) for receiving signaling that indicates a set of instructions from a host device, selecting between a first vector mapping scheme and a second vector mapping scheme for writing vectors to planes of the device, writing, based at least in part on the selected vector mapping scheme, data representative of a first set of contiguous bits of an element of the vector to a first plane and data representative of a second set of contiguous bits of the element to a second plane, and performing, based at least in writing the data representative of the first and second sets of contiguous bits, the computational operation using associative processing.

Some examples of the method 1100 and the apparatus described herein may further include operations, features, circuitry, logic, means, or instructions for determining a ratio of arithmetic operations and logic operations associated with the set of instructions, a length of the vector based at least in part on the plurality of elements, or both, where the selected vector mapping scheme may be selected based at least in part on the ratio, the length of the vector, or both.

In some examples of the method 1100 and the apparatus described herein, the set of instructions indicates a second vector as an operand for the computational operation and the method, apparatuses, and non-transitory computer-readable medium may include further operations, features, circuitry, logic, means, or instructions for writing, based at least in part on the selected vector mapping scheme, data representative of a first set of contiguous bits of an element of the second vector to the first plane and data representative of a second set of contiguous bits of the element of the second vector to the second plane.

Some examples of the method 1100 and the apparatus described herein may further include operations, features, circuitry, logic, means, or instructions for writing, based at least in part on the selected vector mapping scheme, data representative of a first set of contiguous bits of a second element of the vector to the first plane and data representative of a second set of contiguous bits of the second element of the vector to the second plane.

Figure 12:
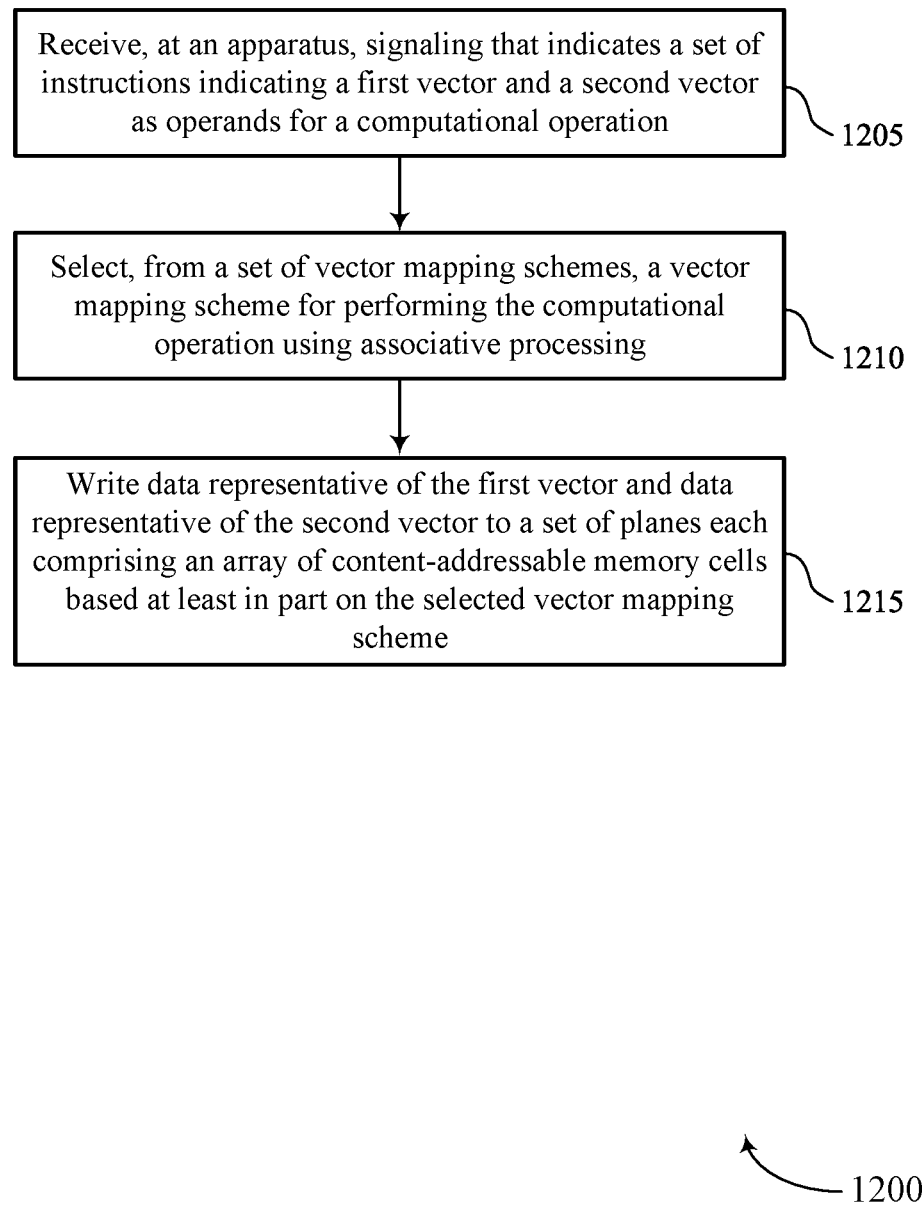

FIG. 12 shows a flowchart illustrating a method 1200 that supports in-memory associative processing in accordance with examples as disclosed herein. The operations of method 1200 may be implemented by a device or its components as described herein. For example, the operations of method 1200 may be performed by an APM system or an APM device as described with reference to FIGS. 1 through 7. In some examples, a device may execute a set of instructions to control the functional elements of the device to perform the described functions. Additionally or alternatively, the device may perform aspects of the described functions using special-purpose hardware.

At 1205, the method may include receiving, at an apparatus, signaling that indicates a set of instructions indicating a first vector and a second vector as operands for a computational operation. The operations of 1205 may be performed in accordance with examples as disclosed herein. In some examples, aspects of the operations of 1205 may be performed by a receive circuitry 725 as described with reference to FIG. 7.

At 1210, the method may include selecting, from a set of vector mapping schemes, a vector mapping scheme for performing the computational operation using associative processing. The operations of 1210 may be performed in accordance with examples as disclosed herein. In some examples, aspects of the operations of 1210 may be performed by a logic 730 as described with reference to FIG. 7.

At 1215, the method may include writing data representative of the first vector and data representative of the second vector to a set of planes each including an array of content-addressable memory cells based at least in part on the selected vector mapping scheme. The operations of 1215 may be performed in accordance with examples as disclosed herein. In some examples, aspects of the operations of 1215 may be performed by an access circuitry 735 as described with reference to FIG. 7.

In some examples, an apparatus as described herein may perform a method or methods, such as the method 1200. The apparatus may include, features, circuitry, logic, means, or instructions (e.g., a non-transitory computer-readable medium storing instructions executable by a processor) for receiving, at an apparatus, signaling that indicates a set of instructions indicating a first vector and a second vector as operands for a computational operation, selecting, from a set of vector mapping schemes, a vector mapping scheme for performing the computational operation using associative processing, and writing data representative of the first vector and data representative of the second vector to a set of planes each including an array of content-addressable memory cells based at least in part on the selected vector mapping scheme.

Some examples of the method 1200 and the apparatus described herein may further include operations, features, circuitry, logic, means, or instructions for receiving an indication of the selected vector mapping scheme from the host device, where the selected vector mapping scheme may be selected based at least in part on the indication.

Some examples of the method 1200 and the apparatus described herein may further include operations, features, circuitry, logic, means, or instructions for determining a quantity of elements in the first vector, a quantity of elements in the second vector, or both, where the selected vector mapping scheme may be selected based on the quantity of elements in the first vector, the quantity of elements in the second vector, or both.

Some examples of the method 1200 and the apparatus described herein may further include operations, features, circuitry, logic, means, or instructions for determining a ratio of logic operations and arithmetic operations associated with the set of instructions, where the selected vector mapping scheme may be selected based on the ratio of logic operations and arithmetic operations.

In some examples of the method 1200 and the apparatus described herein, the set of planes may be in a tile and the method, apparatuses, and non-transitory computer-readable medium may include further operations, features, circuitry, logic, means, or instructions for writing, to a first plane of the set of planes in the tile, data representative of a first set of contiguous bits of an element of the first vector and data representative of a first set of contiguous bits of an element of the second vector and writing to a second plane of the set of planes in the tile, data representative of a second set of contiguous bits of the element of the first vector and data representative of a second set of contiguous bits of the element of the second vector.

In some examples of the method 1200 and the apparatus described herein, and the method, apparatuses, and non-transitory computer-readable medium may include further operations, features, circuitry, logic, means, or instructions for writing, to a first plane of the set of planes in a first tile, data representative of a first set of contiguous bits of an element of the first vector and data representative of a first set of contiguous bits of an element of the second vector and writing, to a second plane of the set of planes in a second tile, data representative of a second set of contiguous bits of the element of the first vector and data representative of a second set of contiguous bits of the element of the second vector.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

Two or more actions may occur "in parallel" if the actions occur at the same time, at substantially the same time, at partially overlapping times, or at wholly overlapping times.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory die comprising a plurality of tiles each comprising a plurality of planes, wherein each plane comprises a respective array of content-addressable memory cells; and
   logic coupled with the memory die and configured to:
      receive signaling that indicates a set of instructions from a host device, the set of instructions indicating a first vector and a second vector as operands for a computational operation;
      select, from a set of vector mapping schemes, a vector mapping scheme for performing the computational operation using associative processing; and
      write data representative of the first vector and the second vector to a set of planes of one or more tiles based at least in part on the selected vector mapping scheme.

2. The apparatus of claim 1, wherein the logic is further configured to:
   perform, using associative processing, the computational operation on the data representative of the first vector and the second vector; and
   write data representative of a third vector that is a result of the computational operation to the set of planes.

3. The apparatus of claim 2, wherein the logic is further configured to:
   compare data representative of bits of the first vector and the second vector with bits of memory cells that store a truth table indicating results of the computational operation for various combinations of logic values, wherein the performing the computational operation is based at least in part on the comparison.

4. The apparatus of claim 1, wherein the logic is further configured to:
   receive an indication of the selected vector mapping scheme from the host device, wherein the selected vector mapping scheme is selected based at least in part on the indication.

5. The apparatus of claim 1, wherein the logic is further configured to:
   determine a quantity of elements of the first vector, a quantity of elements of the second vector, or both, wherein the selected vector mapping scheme is selected based on the quantity of elements of the first vector, the quantity of elements of the second vector, or both.

6. The apparatus of claim 1, wherein the logic is further configured to:
   determine a ratio of logic operations and arithmetic operations associated with the set of instructions, wherein the selected vector mapping scheme is selected based on the ratio of logic operations and arithmetic operations.

7. The apparatus of claim 1, wherein writing further comprises the logic configured to:
   write the data representative of the first vector to different sets of columns of the set of planes than the data representative of the second vector.

8. The apparatus of claim 1, wherein writing further comprises the logic configured to:
   write data representative of different sets of contiguous bits of an element of the first vector to different planes of the set of planes; and
   write data representative of different sets of contiguous bits of an element of the second vector to the different planes of the set of planes.

9. The apparatus of claim 1, wherein the set of planes is in a tile of the plurality of tiles, and wherein writing further comprises the logic configured to:
   write, to a first plane of the set of planes in the tile, data representative of a first set of contiguous bits of an element of the first vector and data representative of a first set of contiguous bits of an element of the second vector; and
   write, to a second plane of the set of planes in the tile, data representative of a second set of contiguous bits of the element of the first vector and data representative of a second set of contiguous bits of the element of the second vector.

10. The apparatus of claim 1, wherein writing further comprises the logic configured to:
    write, to a first plane of the set of planes in a first tile, data representative of a first set of contiguous bits of an element of the first vector and data representative of a first set of contiguous bits of an element of the second vector; and
    write, to a second plane of the set of planes in a second tile, data representative of a second set of contiguous bits of the element of the first vector and data representative of a second set of contiguous bits of the element of the second vector.

11. The apparatus of claim 1, wherein the logic is further configured to:
    retrieve, based at least in part on the set of instructions, the first vector and the second vector from a memory coupled with the logic.

12. An apparatus, comprising:
    a memory die comprising a plurality of tiles each comprising a plurality of planes, wherein each plane comprises a respective array of content-addressable memory cells; and
    logic coupled with the memory die and configured to:
       receive, from a host device, signaling that indicates a set of instructions indicating a vector as an operand for a computational operation, the vector comprising a plurality of elements each having a respective bit length;
       write data representative of a first set of contiguous bits of at least one element of the plurality of elements to a first plane of a tile and data representative of a second set of contiguous bits of the at least one element to a second plane of the tile; and perform, using associative processing, the computational operation based at least in part on writing the data representative of the first set of contiguous bits to the first plane and based at least in part on writing the data representative of the second set of contiguous bits to the second plane.

13. The apparatus of claim 12, wherein the set of instructions indicates a second vector as a second operand for the computational operation, and wherein the logic is further configured to:
   write data representative of a first set of contiguous bits of an element of the second vector to the first plane of the tile and data representative of a second set of contiguous bits of the element of the second vector to the second plane of the tile.

14. The apparatus of claim 12, wherein the logic is further configured to:
   write data representative of a first set of contiguous bits of a second element of the vector to the first plane of the tile and data representative of a second set of contiguous bits of the second element of the vector to the second plane of the tile.

15. The apparatus of claim 12, wherein writing comprises the logic further configured to:
   write the data representative of the first set of contiguous bits to a subset of columns of the first plane and the data representative of the second set of contiguous bits to a subset of columns of the second plane.

16. The apparatus of claim 12, wherein writing is according to a vector mapping scheme, and wherein the logic is further configured to:
   select the vector mapping scheme based at least in part on a quantity of the plurality of elements of the vector being greater than a quantity of rows per plane of the plurality of planes.

17. The apparatus of claim 12, wherein writing is according to a vector mapping scheme, and wherein the logic is further configured to:
   select the vector mapping scheme based at least in part on the set of instructions being associated with a ratio of arithmetic operations and logic operations that is greater than a threshold ratio.

18. The apparatus of claim 12, wherein performing comprises the logic further configured to:
   compare data representative of bits of the vector and bits of a second vector with bits of memory cells that store a truth table indicating results of the computational operation for various combinations of logic values; and
   write data representative of a third vector that is a result of the computational operation to the plurality of planes based at least in part on the comparison.

19. An apparatus, comprising:
   a memory die comprising a plurality of tiles each comprising a plurality of planes, wherein each plane comprises a respective array of content-addressable memory cells; and
   logic coupled with the memory die and configured to:
      receive, from a host device, signaling that indicates a set of instructions indicating a vector as an operand for a computational operation, the vector comprising a plurality of elements each having a respective bit length;
      write data representative of a first set of contiguous bits of at least one element of the plurality of elements to a first plane of a first tile and data representative of a second set of contiguous bits of the at least one element to a second plane of a second tile; and
      perform, using associative processing, the computational operation based at least in part on writing the data representative of the first set of contiguous bits to the first plane and based at least in part on writing the data representative of the second set of contiguous bits to the second plane.

20. The apparatus of claim 19, wherein the set of instructions indicates a second vector as a second operand for the computational operation, and wherein the logic is further configured to:
   write data representative of a first set of contiguous bits of an element of the second vector to the first plane of the first tile and data representative of a second set of contiguous bits of the element of the second vector to the second plane of the second tile.

21. The apparatus of claim 19, wherein the logic is further configured to:
   write data representative of a first set of contiguous bits of a second element of the vector to the first plane of the first tile and data representative of a second set of contiguous bits of the second element to the second plane of the second tile.

22. The apparatus of claim 19, wherein writing comprises the logic further configured to:
   write the data representative of the first set of contiguous bits to a subset of columns of the first plane and the data representative of the second set of contiguous bits to a subset of columns of the second plane.

23. The apparatus of claim 19, wherein writing is according to a vector mapping scheme, and wherein the logic is further configured to:
   select the vector mapping scheme based at least in part on a quantity of the plurality of elements of the vector being greater than a quantity of rows per plane of the plurality of planes.

24. The apparatus of claim 19, wherein writing is according to a vector mapping scheme, and wherein the logic is further configured to:
   select the vector mapping scheme based at least in part on the set of instructions being associated with a ratio of arithmetic operations and logic operations that is greater than a threshold ratio.

25. The apparatus of claim 19, wherein performing comprises the logic further configured to:
   compare data representative of bits of the vector and bits of a second vector with bits of memory cells that store a truth table indicating results of the computational operation for various combinations of logic values; and
   write data representative of a third vector that is a result of the computational operation to the plurality of planes based at least in part on the comparison.

26. An apparatus, comprising:
   a host device configured to transmit signaling that indicates a set of instructions indicating a vector as an operand for a computational operation, the vector comprising a plurality of elements each having a respective bit length;
   a device coupled with the host device and configured to perform associative processing, the device comprising a plurality of tiles that each comprise a plurality of planes, wherein each plane comprises a respective array of content-addressable memory cells; and
   logic coupled with the device and configured to:
      receive the signaling that indicates the set of instructions from the host device;

select between a first vector mapping scheme and a second vector mapping scheme for writing vectors to planes of the device;

write, based at least in part on the selected vector mapping scheme, data representative of a first set of contiguous bits of an element of the vector to a first plane and data representative of a second set of contiguous bits of the element to a second plane; and perform, based at least in writing the data representative of the first and second sets of contiguous bits, the computational operation using associative processing.

27. The apparatus of claim 26, wherein the logic is further configured to:

determine a ratio of arithmetic operations and logic operations associated with the set of instructions, a length of the vector based at least in part on the plurality of elements, or both, wherein the selected vector mapping scheme is selected based at least in part on the ratio, the length of the vector, or both.

28. The apparatus of claim 26, wherein the set of instructions indicates a second vector as an operand for the computational operation, wherein the logic is further configured to:

write, based at least in part on the selected vector mapping scheme, data representative of a first set of contiguous bits of an element of the second vector to the first plane and data representative of a second set of contiguous bits of the element of the second vector to the second plane.

29. The apparatus of claim 26, wherein the logic is further configured to:

write, based at least in part on the selected vector mapping scheme, data representative of a first set of contiguous bits of a second element of the vector to the first plane and data representative of a second set of contiguous bits of the second element of the vector to the second plane.

30. A method, comprising:

receiving, at an apparatus, signaling that indicates a set of instructions indicating a first vector and a second vector as operands for a computational operation;

selecting, from a set of vector mapping schemes, a vector mapping scheme for performing the computational operation using associative processing; and writing data representative of the first vector and data representative of the second vector to a set of planes each comprising an array of content-addressable memory cells based at least in part on the selected vector mapping scheme.

31. The method of claim 30, further comprising:

receiving an indication of the selected vector mapping scheme from a host device, wherein the selected vector mapping scheme is selected based at least in part on the indication.

32. The method of claim 30, further comprising:

determining a quantity of elements in the first vector, a quantity of elements in the second vector, or both, wherein the selected vector mapping scheme is selected based on the quantity of elements in the first vector, the quantity of elements in the second vector, or both.

33. The method of claim 30, further comprising:

determining a ratio of logic operations and arithmetic operations associated with the set of instructions, wherein the selected vector mapping scheme is selected based on the ratio of logic operations and arithmetic operations.

34. The method of claim 30, wherein the set of planes is in a tile, the method further comprising:

writing, to a first plane of the set of planes in the tile, data representative of a first set of contiguous bits of an element of the first vector and data representative of a first set of contiguous bits of an element of the second vector; and writing to a second plane of the set of planes in the tile, data representative of a second set of contiguous bits of the element of the first vector and data representative of a second set of contiguous bits of the element of the second vector.

35. The method of claim 30, the method further comprising:

writing, to a first plane of the set of planes in a first tile, data representative of a first set of contiguous bits of an element of the first vector and data representative of a first set of contiguous bits of an element of the second vector; and writing, to a second plane of the set of planes in a second tile, data representative of a second set of contiguous bits of the element of the first vector and data representative of a second set of contiguous bits of the element of the second vector.

* * * * *